US008851769B2

(12) United States Patent
Kaneyama

(10) Patent No.: US 8,851,769 B2
(45) Date of Patent: Oct. 7, 2014

(54) SUBSTRATE PROCESSING METHOD

(71) Applicant: Koji Kaneyama, Kyoto (JP)

(72) Inventor: Koji Kaneyama, Kyoto (JP)

(73) Assignee: Sokudo Co., Ltd. (JP)

( * ) Notice: Subject to any disclaimer, the term of this patent is extended or adjusted under 35 U.S.C. 154(b) by 0 days.

(21) Appl. No.: 14/132,592

(22) Filed: Dec. 18, 2013

(65) Prior Publication Data

US 2014/0104586 A1 Apr. 17, 2014

Related U.S. Application Data

(62) Division of application No. 13/091,711, filed on Feb. 2, 2011, now Pat. No. 8,635,968.

(30) Foreign Application Priority Data

Mar. 26, 2010 (JP) ................................. 2010-072721

(51) Int. Cl.
G03D 5/00 (2006.01)
B05C 13/02 (2006.01)
G03B 27/58 (2006.01)
H01L 21/677 (2006.01)
H01L 21/687 (2006.01)
H01L 21/67 (2006.01)
G03F 7/20 (2006.01)

(52) U.S. Cl.
CPC ............ G03F 7/70975 (2013.01); G03B 27/58 (2013.01); H01L 21/67745 (2013.01); H01L 21/68707 (2013.01); H01L 21/67051 (2013.01); H01L 21/67046 (2013.01); G03F 7/70741 (2013.01); Y10S 134/902 (2013.01)
USPC .................. 396/611; 118/62; 118/63; 118/66; 118/500; 118/503; 134/902

(58) Field of Classification Search
USPC ................ 396/611; 118/62, 63, 66, 500, 503; 134/902
See application file for complete search history.

(56) References Cited

U.S. PATENT DOCUMENTS

| | | | |
|---|---|---|---|
| 5,974,682 A | 11/1999 | Akimoto | |
| 6,245,156 B1 | 6/2001 | Taniyama et al. | |
| 6,520,733 B1 | 2/2003 | Taniyama et al. | |
| 2006/0147201 A1 | 7/2006 | Asano et al. | |

(Continued)

FOREIGN PATENT DOCUMENTS

| | | |
|---|---|---|
| JP | 06-345262 | 12/1994 |
| JP | 10-074818 | 3/1998 |

(Continued)

OTHER PUBLICATIONS

Japanese Office Action in counterpart Japanese Patent Application 2010-072721 dated Jul. 17, 2012.
Decision of Refusal dated Apr. 2, 2013 in counterpart Japanese Application 2010-072721.

Primary Examiner — Rodney Fuller
(74) Attorney, Agent, or Firm — Ostrolenk Faber LLP

(57) ABSTRACT

A substrate processing method for a substrate having a photosensitive film on a top surface thereof, includes cleaning a back surface of the substrate after the formation of the photosensitive film and before exposure processing; transporting the substrate to a temperature adjuster such as a cooling unit, while holding the substrate with a first holder; adjusting a temperature of the substrate with the temperature adjuster; transporting the substrate from the temperature adjuster to the exposure device with a second holder; and transporting the substrate after the exposure processing to a first platform while holding the substrate with a third holder.

10 Claims, 13 Drawing Sheets

(56) References Cited

U.S. PATENT DOCUMENTS

| | | |
|---|---|---|
| 2006/0194352 A1 | 8/2006 | Peng et al. |
| 2007/0122737 A1 | 5/2007 | Ishida et al. |
| 2009/0025155 A1 | 1/2009 | Nishiyama et al. |
| 2009/0120472 A1 | 5/2009 | Nishiyama et al. |
| 2012/0156626 A1 | 6/2012 | Ishida et al. |

FOREIGN PATENT DOCUMENTS

| | | |
|---|---|---|
| JP | 11-251398 | 9/1999 |
| JP | 11-330190 | 11/1999 |
| JP | 2006-190921 | 7/2006 |
| JP | 2007-150071 | 6/2007 |
| JP | 2007-214365 | 8/2007 |
| JP | 2009-71008 | 4/2009 |
| JP | 2009-123800 | 6/2009 |

SUBSTRATE PROCESSING METHOD

BACKGROUND OF THE INVENTION

1. Field of the Invention

The present invention relates to a substrate processing apparatus and a substrate processing method for subjecting a substrate to processing.

2. Description of the Background Art

Substrate processing apparatuses are used to subject various substrates such as semiconductor substrates, substrates for liquid crystal displays, plasma displays, optical disks, magnetic disks, magneto-optical disks, photomasks, and other substrates to various types of processing.

In such substrate processing apparatuses, a substrate before exposure processing is subjected to various types of film formation processing. However, a back surface of the substrate may be contaminated in the process of film formation processing. In this case, irregularities are formed on the back surface of the substrate due to contaminants, resulting in an unstable state of the substrate. This may cause a dimensional error and a shape defect of an exposure pattern during the exposure processing.

In order to avoid such problems, a substrate processing apparatus of JP 2007-214365 A is provided with a back surface cleaning unit that cleans the back surface of the substrate before exposure processing, for example. This allows contaminants adhering to the back surface of the substrate before exposure processing to be removed.

With recent improvements in the density and integration of devices, making finer resist patterns has been required. Resolution performance, which is a key to obtain finer resist patterns, of an exposure device depends on the wavelength of a light source of the exposure device. Exposure techniques that use EUV (extra-ultraviolet) having an extremely short wavelength of about 13 nm have been proposed. Since the EUV is easily absorbed by the air, exposure processing using the EUV needs to be performed in a state whose degree of vacuum is high. Therefore, the substrate in a clean state needs to be carried in the exposure device for performing the exposure processing using the EUV.

BRIEF SUMMARY OF THE INVENTION

An object of the present invention is to provide a substrate processing apparatus and a substrate processing method capable of carrying a substrate in a clean state in an exposure device.

(1) According to an aspect of the present invention, a substrate processing apparatus that is arranged adjacent to an exposure device includes a processing section for subjecting a top surface of a substrate to processing, and an interface for receiving and transferring the substrate between the processing section and the exposure device, wherein the processing section includes a photosensitive film forming unit arranged to form a photosensitive film made of a photosensitive material on the top surface of the substrate, the interface includes a back surface cleaning unit arranged to clean a back surface of the substrate after formation of the photosensitive film by the photosensitive film forming unit and before exposure processing by the exposure device, and a transport device that includes a plurality of holders, each of which transports the substrate while holding the substrate, and the transport device is configured to transport the substrate after back surface cleaning by the back surface cleaning unit to the exposure device while holding the substrate after the back surface cleaning using one or a plurality of holders of the plurality of holders, and transport the substrate after the exposure processing from the exposure device while holding the substrate after the exposure processing using other holders of the plurality of holders.

In the substrate processing apparatus, the photosensitive film made of the photosensitive material is formed on the top surface of the substrate by the photosensitive film forming unit. The back surface of the substrate is cleaned by the back surface cleaning unit after the formation of the photosensitive film and before the exposure processing by the exposure device. The substrate after the cleaning is transported to the exposure device while being held by the one or plurality of holders of the plurality of holders of the transport device. The substrate after the exposure processing is transported from the exposure device while being held by the other holders of the plurality of holders of the transport device.

As described above, the different holders are used for holding and transporting the substrate after the back surface cleaning to the exposure device and for holding and transporting the substrate after the exposure processing from the exposure device. Therefore, even though contaminants adhere to the substrate after the exposure processing, the contaminants will not adhere to the holder that holds the substrate after the back surface cleaning. Thus, the substrate in a clean state after the back surface cleaning can be carried in the exposure device. This prevents the inside of the exposure device from being contaminated. Accordingly, even when the exposure processing is performed in vacuum in the exposure device, a degree of vacuum is prevented from being lowered due to the contaminants. In addition, the inside of the exposure device is less contaminated, thus reducing a period of time required for removing the contaminants. This prevents a lower operation rate of the substrate processing apparatus.

(2) The interface may further include a temperature adjuster arranged to adjust a temperature of the substrate, the one or plurality of holders may include a first holder arranged to transport the substrate before the exposure processing from the temperature adjuster to the exposure device while holding the substrate before the exposure processing, and a second holder arranged to transport the substrate after the back surface cleaning from the back surface cleaning unit to the temperature adjuster while holding the substrate after the back surface cleaning.

In this case, the substrate after the back surface cleaning is transported from the back surface cleaning unit to the temperature adjuster while being held by the second holder. The temperature of the substrate is adjusted by the temperature adjuster. The substrate after the temperature adjustment is transported from the temperature adjuster to the exposure device while being held by the first holder. Accordingly, the substrate can be prevented from being deformed at the time of being carried in the exposure device due to a difference in temperature between the inside and outside of the exposure device, and the back surface of the substrate can be prevented from being contaminated.

The different holders are used for holding and transporting the substrate from the back surface cleaning processing unit to the temperature adjuster and for holding and transporting the substrate from the temperature adjuster to the exposure device. Thus, the temperature of the holder that holds the substrate whose temperature has been adjusted is kept constant. This prevents the temperature of the substrate from changing when the substrate is transported from the temperature adjuster to the exposure device.

(3) The temperature adjuster may include a housing arranged to surround the substrate, and a gas supplier arranged to supply dry gas into the housing.

In this case, dry gas is supplied into the housing of the temperature adjuster. This causes the substrate to be reliably dried. Therefore, the substrate in a completely dry state can be carried in the exposure device. This reliably prevents a degree of vacuum from being lowered even when the exposure processing is performed in vacuum in the exposure device.

(4) The interface may further include a platform on which the substrate after the exposure processing is placed, and the other holders may include a third holder arranged to transport the substrate from the exposure device to the platform while holding the substrate.

In this case, the substrate is transported from the exposure device to the platform while being held by the third holder. Since the substrate after the exposure processing can be temporarily kept on standby, a period of time for transporting the substrate before the exposure processing and a period of time for transporting the substrate after the exposure processing can be adjusted. As a result, transport efficiency of the substrate can be improved and a period of time from the exposure processing to the subsequent processing can be appropriately adjusted.

(5) The transport device may include first and second transport units, the first transport unit includes the first holder, the second holder and the third holder, the second transport unit may include a fourth holder arranged to transport the substrate after the formation of the photosensitive film from the processing section to the interface while holding the substrate after the formation of the photosensitive film, and a fifth holder arranged to transport the substrate after the exposure processing while holding the substrate after the exposure processing in the interface.

In this case, the substrate after the formation of the photosensitive film is transported from the processing section to the interface while being held by the fourth holder of the second transport unit. The substrate after the exposure processing is transported in the interface while being held by the fifth holder of the second transport unit. Accordingly, the first transport unit transports the substrate from the back surface cleaning processing unit to the temperature adjuster, from the temperature adjuster to the exposure device, and from the exposure device to the platform, and the second transport unit transports the substrate from the processing section to the interface and in the interface. This allows the first transport unit and the second transport unit to be concurrently operated. As a result, the clean substrate can be carried in the exposure device without reducing transport efficiency of the substrate.

(6) The third holder may be arranged below the first and second holders. When the substrate after the exposure processing is less clean than the substrate before the exposure processing, contaminants may drop from the substrate after the exposure processing or the third holder that holds the substrate after the exposure processing. Even in such a case, the first and second holders are arranged above the third holder, so that the contaminants will not adhere to the substrate before the exposure processing held by the first and second holders. This reliably prevents the substrate to be carried in the exposure device from being contaminated.

(7) The first holder may be arranged above the second holder. When a liquid remains on the substrate after the back surface cleaning, the liquid may drop from the substrate after the back surface cleaning or the second holder that holds the substrate after the back surface cleaning. Even in such a case, the first holder is arranged above the second holder, so that the liquid will not adhere to the substrate after the temperature adjustment held by the first holder. Accordingly, the temperature of the substrate after the temperature adjustment can be prevented from changing, and the substrate with the liquid adhering thereto can be prevented from being carried in the exposure device.

(8) The transport device may include first and second transport units, the first transport unit may include the first holder and the third holder, the second transport unit may include the second holder, a fourth holder arranged to transport the substrate after the formation of the photosensitive film from the processing section to the interface while holding the substrate after the formation of the photosensitive film, and a fifth holder arranged to transport the substrate after the formation of the photosensitive film to the back surface cleaning unit while holding the substrate after the formation of the photosensitive film in the interface.

In this case, the substrate after the formation of the photosensitive film is transported from the processing section to the interface while being held by the fourth holder of the second transport unit. The substrate after the formation of the photosensitive film is transported to the back surface cleaning unit while being held by the fifth holder of the second transport unit in the interface. Accordingly, the first transport unit transports the substrate from the temperature adjuster to the exposure device and from the exposure device to the platform, and the second transport unit transports the substrate from the back surface cleaning processing unit to the temperature adjuster, from the processing section to the interface, and to the back surface cleaning unit in the interface. This allows the first transport unit and the second transport unit to be concurrently operated. As a result, the clean substrate can be carried in the exposure device without reducing transport efficiency of the substrate.

(9) The first holder may be arranged above the third holder. When the substrate after the exposure processing is less clean than the substrate before the exposure processing, contaminants may drop from the substrate after the exposure processing or the third holder that holds the substrate after the exposure processing. Even in such a case, the first holder is arranged above the third holder, so that the contaminants will not adhere to the substrate before the exposure processing held by the first holder. This reliably prevents the substrate to be carried in the exposure device from being contaminated.

(10) The second holder may be arranged above the fourth and fifth holders. When the substrate before the back surface cleaning held by the fourth or fifth holder is contaminated, the contaminants may drop from the substrate before the back surface cleaning or the fourth or fifth holder that holds the substrate before the back surface cleaning. Even in such a case, the second holder is arranged above the fourth and fifth holders, so that the contaminants will not adhere to the substrate after the back surface cleaning held by the second holder. This reliably prevents the substrate to be carried in the exposure device from being contaminated.

(11) According to another aspect of the present invention, a substrate processing method for subjecting a substrate to processing using a substrate processing apparatus arranged adjacent to an exposure device, wherein the substrate processing apparatus includes a photosensitive film forming unit, a back surface cleaning unit and a transport device including a plurality of holders, and the substrate processing method includes the steps of forming a photosensitive film made of a photosensitive material on a top surface of the substrate by the photosensitive film forming unit, cleaning a back surface of the substrate by the back surface cleaning unit after the formation of the photosensitive film and before exposure processing by the exposure device, transporting the substrate after the cleaning to the exposure device while holding the substrate after the cleaning using one or a plurality of holders of the plurality of holders of the transport device, and transporting the substrate after the exposure processing from the exposure device while holding the substrate after the exposure processing using other holders of the plurality of holders of the transport device.

In the substrate processing method, the photosensitive film made of the photosensitive material is formed on the top surface of the substrate by the photosensitive film forming unit. The back surface of the substrate is cleaned by the back surface cleaning unit after the formation of the photosensitive film and before the exposure processing by the exposure device. The substrate after the cleaning is transported to the exposure device while being held by the one or plurality of holders of the plurality of holders of the transport device. The substrate after the exposure processing is transported from the exposure device while being held by the other holders of the plurality of holders of the transport device.

As described above, the different holders are used for holding and transporting the substrate after the back surface cleaning to the exposure device and for holding and transporting the substrate after the exposure processing from the exposure device. Therefore, even though contaminants adhere to the substrate after the exposure processing, the contaminants will not adhere to the holder that holds the substrate after the back surface cleaning. Thus, the substrate in a clean state after the back surface cleaning can be carried in the exposure device. This prevents the inside of the exposure device from being contaminated. Accordingly, even when the exposure processing is performed in vacuum in the exposure device, a degree of vacuum is prevented from being lowered due to the contaminants. In addition, the inside of the exposure device is less contaminated, thus reducing a period of time required for removing the contaminants. This prevents a lower operation rate of the substrate processing apparatus.

Other features, elements, characteristics, and advantages of the present invention will become more apparent from the following description of preferred embodiments of the present invention with reference to the attached drawings.

BRIEF DESCRIPTION OF THE SEVERAL
VIEWS OF THE DRAWINGS

FIG. 6 (b) is a sectional view of the chuck opening/closing device and the chucks shown in FIG. 6 (a) taken along the line A-A;

DETAILED DESCRIPTION OF THE INVENTION

Description will be made of a substrate processing apparatus according to embodiments of the present invention with reference to the drawings. In the following description, substrates refer to semiconductor substrates, substrates for liquid crystal displays, plasma displays, optical disks, magnetic disks, magneto-optical disks, photomasks, glass substrates for photomasks, or other substrates.

[1] First Embodiment (1) Configuration of Substrate Processing Apparatus

Figure 1:
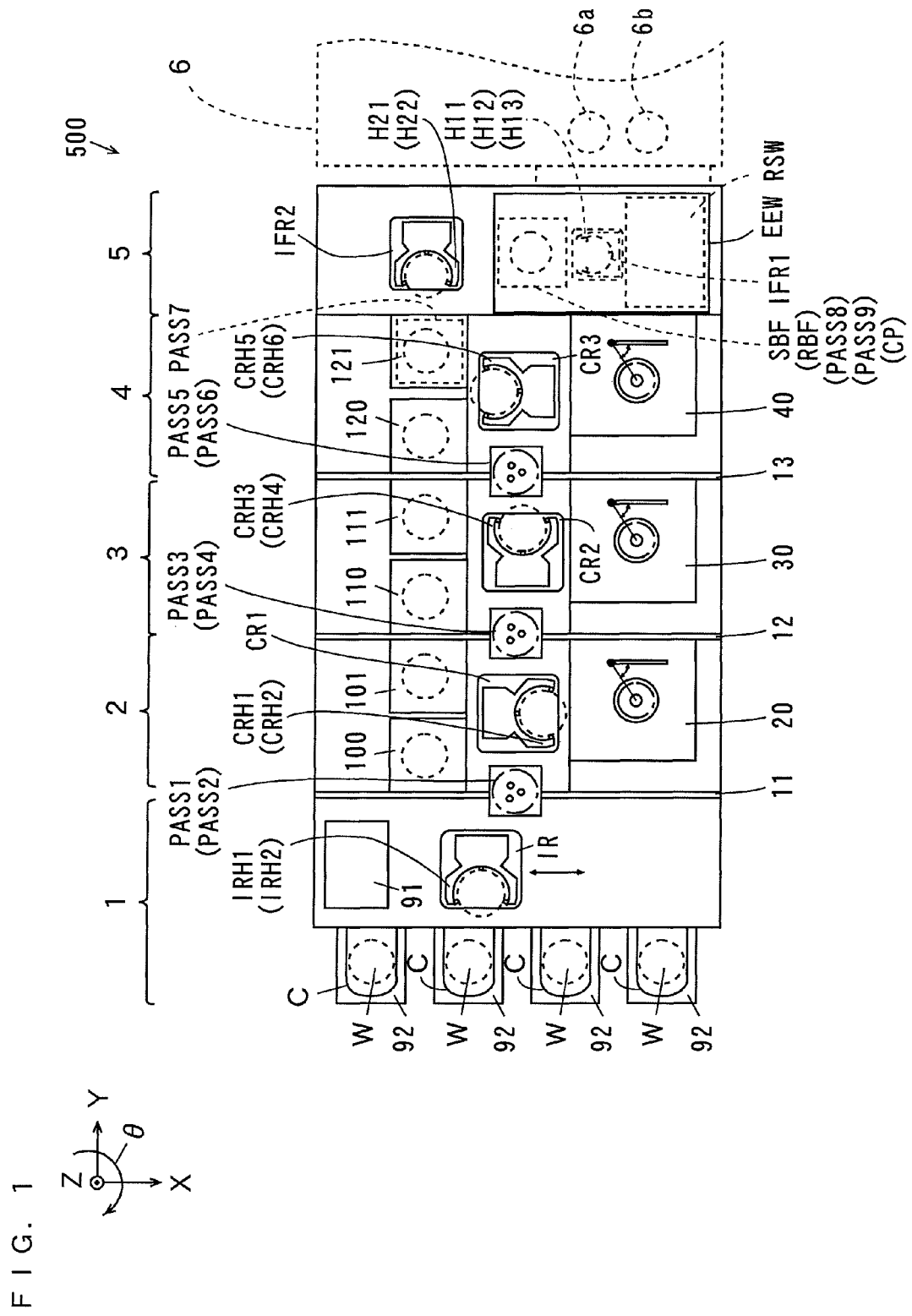
FIG. 1 is a plan view of a substrate processing apparatus according to a first embodiment.

FIG. 1 is a plan view of a substrate processing apparatus according to a first embodiment. FIG. 1 and FIGS. 2 to 4 described below are accompanied by arrows that respectively indicate X, Y, and Z directions perpendicular to one another for clarity of a positional relationship. The X and Y directions are perpendicular to each other within a horizontal plane, and the Z direction corresponds to a vertical direction. In each of the directions, the direction of the arrow is defined as a + direction, and the opposite direction is defined as a − direction. The rotation direction about the Z direction is defined as a θ direction.

As shown in FIG. 1, the substrate processing apparatus 500 includes an indexer block 1, an anti-reflection film processing block 2, a resist film processing block 3, a development processing block 4 and an interface block 5. An exposure device 6 is arranged adjacent to the interface block 5. The exposure device 6 is a vacuum exposure device in the present embodiment.

Hereinafter, the indexer block 1, the anti-reflection film processing block 2, the resist film processing block 3, the development processing block 4, and the interface block 5 will be referred to as processing blocks.

The indexer block 1 includes a main controller (control unit) 91 that controls operations of the processing blocks, and includes a plurality of carrier platforms 92 and an indexer robot IR. The indexer robot IR is provided with hands IRH1, IRH2 one above the other for receiving and transferring the substrate W.

The anti-reflection film processing block 2 includes thermal processing groups 100 and 101 for anti-reflection film, a coating processing group 20 for anti-reflection film, and a first central robot CR1. The coating processing group 20 for anti-reflection film is provided opposite to the thermal processing groups 100 and 101 for anti-reflection film with the first central robot CR1 interposed therebetween. The first central robot CR1 is provided with hands CRH1, CRH2 one above the other for receiving and transferring the substrate W.

A partition wall 11 for shielding the atmosphere is provided between the indexer block 1 and the anti-reflection film processing block 2. The partition wall 11 is provided with substrate platforms PASS1 and PASS2 one above the other in close proximity that are used for receiving and transferring the substrate W between the indexer block 1 and the anti-reflection film processing block 2. The upper substrate platform PASS1 is used when the substrate W is transported from the indexer block 1 to the anti-reflection film processing block 2. The lower substrate platform PASS2 is used when the substrate W is transported from the anti-reflection film processing block 2 to the indexer block 1.

The substrate platforms PASS1, PASS2 are each provided with an optical sensor (not shown) that detects the presence or absence of the substrate W. This allows for determination as to whether or not the substrate W is placed on the substrate platform PASS1 or PASS2. In addition, the substrate platforms PASS1, PASS2 each have a plurality of support pins secured thereto. Note that substrate platforms PASS3 to PASS9 that will be described below are each similarly provided with an optical sensor and support pins.

The resist film processing block 3 includes thermal processing groups 110 and 111 for resist film, a coating processing group 30 for resist film, and a second central robot CR2. The coating processing group 30 for resist film is provided opposite to the thermal processing groups 110 and 111 for resist film with the second central robot CR2 interposed therebetween. The second central robot CR2 has hands CRH3, CRH4 provided one above the other used for receiving and transferring the substrate W.

A partition wall 12 for shielding the atmosphere is provided between the anti-reflection film processing block 2 and the resist film processing block 3. The partition wall 12 is provided with the substrate platforms PASS3, PASS4 one above the other in close proximity that are used for receiving and transferring the substrate W between the anti-reflection film processing block 2 and the resist film processing block 3. The upper substrate platform PASS3 is used when the substrate W is transported from the anti-reflection film processing block 2 to the resist film processing block 3, and the lower substrate platform PASS4 is used when the substrate W is transported from the resist film processing block 3 to the anti-reflection film processing block 2.

The development processing block 4 includes a thermal processing group 120 for development, a thermal processing group 121 for post-exposure bake, a development processing group 40, and a third central robot CR3. The development processing block 4 is provided adjacent to the interface block 5 and includes substrate platforms PASS7 as described below. The development processing group 40 is provided opposite to the thermal processing group 120 for development and the thermal processing group 121 for post-exposure bake with the third central robot CR3 interposed therebetween. The third central robot CR3 has hands CRH5, CRH6 provided one above the other used for receiving and transferring the substrate W.

A partition wall 13 for shielding the atmosphere is provided between the resist film processing block 3 and the development processing block 4. The partition wall 13 has substrate platforms PASS5, PASS6 provided one above the other in close proximity that receive and transfer the substrate W between the resist film processing block 3 and the development processing block 4. The upper substrate platform PASS5 is used when the substrate W is transported from the resist film processing block 3 to the development processing block 4 and the lower substrate platform PASS6 is used when the substrate W is transported from the development processing block 4 to the resist film processing block 3.

The interface block 5 includes a back surface cleaning processing unit RSW, interface transport mechanisms IFR1, IFR2, an edge exposure unit EEW, a sending buffer unit SBF, a return buffer unit RBF, substrate platforms PASS8, PASS9, and a cooling unit (cooling plate) CP. The back surface cleaning processing unit RSW subjects a back surface of the substrate W before exposure processing to cleaning processing and drying processing. Here, the back surface of the substrate W refers to a surface on the opposite side of the surface having various films formed thereon by the processing blocks. Details of the back surface cleaning processing unit RSW will be described below.

The interface transport mechanism IFR2 is provided with hands H21, H22 (see FIG. 4, described below) one above the other for receiving and transferring the substrate W, and the interface transport mechanism IFR1 is provided with hands H11, H12, H13 (see FIG. 4, described below) one above another for receiving and transferring the substrate W. Details of the interface block 5 will be described below.

In the substrate processing apparatus 500 according to the present embodiment, the indexer block 1, the anti-reflection film processing block 2, the resist film processing block 3, the development processing block 4 and the interface block 5 are sequentially arranged side by side along the Y-direction.

Figure 2:
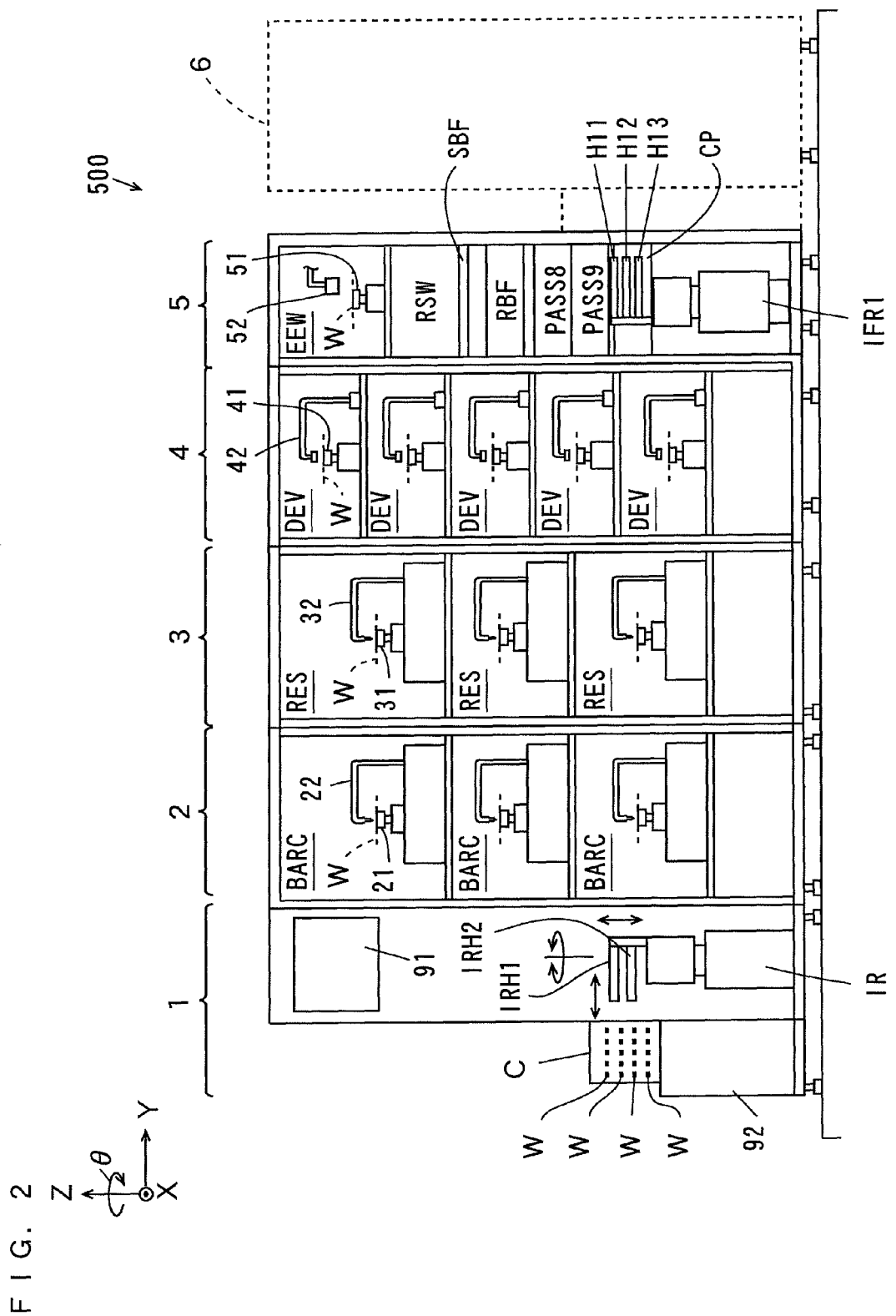
FIG. 2 is a schematic side view showing one side of the substrate processing apparatus of FIG. 1.
Figure 3:
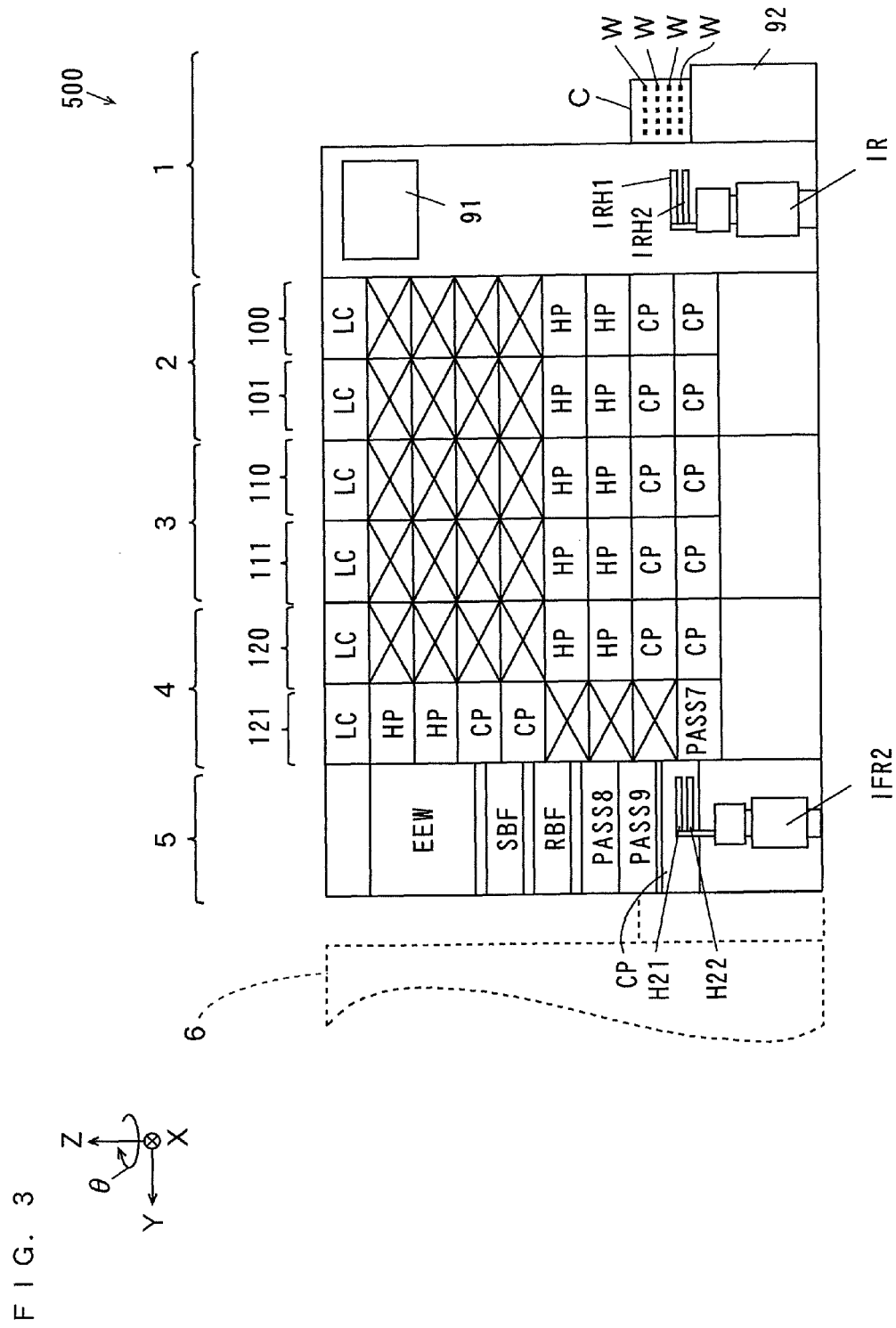
FIG. 3 is a schematic side view showing the other side of the substrate processing apparatus of FIG. 1.

FIG. 2 is a schematic side view showing one side of the substrate processing apparatus 500 of FIG. 1, and FIG. 3 is a schematic side view showing the other side of the substrate processing apparatus 500 of FIG. 1. FIG. 2 mainly shows components provided in a region along one side surface of the substrate processing apparatus 500 (hereinafter referred to as the +X side), and FIG. 3 mainly shows components provided in a region along the other side surface of the substrate processing apparatus 500 (hereinafter referred to as the −X side).

The configuration on the +X side of the substrate processing apparatus 500 will be first described with reference to FIG. 2. As illustrated in FIG. 2, the coating processing group 20 for anti-reflection film (see FIG. 1) in the anti-reflection film processing block 2 has a vertical stack of three coating units BARC. Each of the coating units BARC includes a spin chuck 21 for rotating the substrate W with the substrate W held in a horizontal attitude by suction, and a supply nozzle 22 that supplies a coating liquid for anti-reflection film to the substrate W held on the spin chuck 21.

The coating processing group 30 for resist film (see FIG. 1) in the resist film processing block 3 has a vertical stack of three coating units RES. Each of the coating units RES includes a spin chuck 31 for rotating the substrate W with the substrate W held in a horizontal attitude by suction, and a supply nozzle 32 that supplies a coating liquid for resist film to the substrate W held on the spin chuck 31.

The development processing group 40 (see FIG. 1) in the development processing block 4 has a vertical stack of five development processing units DEV. Each of the development processing units DEV includes a spin chuck 41 for rotating the substrate W with the substrate W held in a horizontal attitude by suction, and a supply nozzle 42 for supplying a development liquid to the substrate W held on the spin chuck 41.

The interface block 5 has a vertical stack of the edge exposure unit EEW and the back surface cleaning processing unit RSW on the +X side. The edge exposure unit EEW includes a spin chuck 51 for rotating the substrate W with the substrate W held in a horizontal attitude by suction, and a light irradiator 52 for exposing an edge of the substrate W held on the spin chuck 51.

The interface block 5 has a vertical stack of the sending buffer unit SBF, the return buffer unit RBF, the substrate platforms PASS8, PASS9, and the cooling unit CP at substantially the center thereof in the X-direction (see FIG. 4 described below). FIG. 2 shows part of the sending buffer unit SBF, the return buffer unit RBF, the substrate platforms PASS8, PASS9, and the cooling unit CP.

The configuration on the −X side of the substrate processing apparatus 500 will be then described with reference to FIG. 3. As illustrated in FIG. 3, each of the thermal processing groups 100 and 101 for anti-reflection film in the anti-reflection film processing block 2 has a stack of two heating units (hot plates) HP and two cooling units (cooling plates) CP. Each of the thermal processing groups 100 and 101 for anti-reflection film has a local controller LC for controlling the respective temperatures of the heating units HP and the cooling units CP arranged in its uppermost part.

Each of the thermal processing groups 110 and 111 for resist film in the resist film processing block 3 has a stack of two heating units HP and two cooling units CP. Each of the thermal processing groups 110 and 111 for resist film also has a local controller LC for controlling the respective temperatures of the heating units HP and the cooling units CP arranged in its uppermost part.

The thermal processing group 120 for development in the development processing block 4 has a vertical stack of two heating units HP and two cooling units CP, and the thermal processing group 121 for post-exposure bake has a vertical stack of the substrate platform PASS7, two heating units HP and two cooling units CP. Each of the thermal processing group 120 for development and the thermal processing group 121 for post-exposure bake also has a local controller LC for controlling the respective temperatures of the heating units HP and the cooling units CP arranged in its uppermost part.

Similarly to FIG. 2, FIG. 3 shows part of the edge exposure unit EEW, the sending buffer unit SBF, the return buffer unit RBF, the substrate platforms PASS8, PASS9, and the cooling unit CP.

Next, description will be made of details of the interface block 5 with reference to FIG. 4. FIG. 4 is a schematic side view of the interface block 5 viewed from the exposure device 6. A connection opening 121b that communicates with the thermal processing group 121 for post-exposure bake of the development processing block 4 is arranged on the −X side in the interface block 5. The interface block 5 has the vertical stack of the edge exposure unit EEW and the back surface cleaning processing unit RSW in its upper part on the +X side.

The interface block 5 has the vertical stack of the sending buffer unit SBF, the return buffer unit RBF, the substrate platforms PASS8, PASS9, and the cooling unit CP at substantially the center thereof below the edge exposure unit EEW.

The interface transport mechanisms IFR1, IFR2 are provided in a lower part of the interface block 5. Description will be made of the configurations of the interface transport mechanisms IFR1, IFR2.

The interface transport mechanism IFR2 includes a base B2, a support S2, a lifting shaft T2, an arm A2 and a motor M2. The support S2 is mounted on the base B2 so as to be rotatable in the ±θ direction and movable up and down in the ±Z direction. The support S2 is coupled to the motor M2 in the base B2 through the lifting shaft T2, and rotated by the motor M2. The two hands H21, H22 that hold the substrate W in a horizontal attitude are provided one above the other in the support S2 through the arm A2 so as to be movable back and forth. Here, the hand H21 is in a position higher than the hand H22.

The interface transport mechanism IFR2 is configured to be able to transport the substrate W among the connection opening 121b, the edge exposure unit EEW, the sending buffer unit SBF, the return buffer unit RBF, the substrate platforms PASS8, PASS9 and the cooling unit CP.

The interface transport mechanism IFR1 includes a base B1, a support S1, a lifting shaft T1, an arm A1 and a motor M1. The support S1 is mounted on the base B1 so as to be rotatable in the ±θ direction and movable up and down in the ±Z direction. The support S1 is coupled to the motor M1 in the base B1 through the lifting shaft T1, and rotated by the motor M1. The three hands H11, H12, H13 that hold the substrate W in a horizontal attitude are provided one above another in the support S1 through the arm A1 so as to be movable back and forth. Here, the hand H11 is in a position higher than the hand H12, and the hand H12 is in a position higher than the hand H13.

The interface transport mechanism IFR1 is configured to be able to transport the substrate W among the back surface cleaning processing unit RSW, the sending buffer unit SBF, the return buffer unit RBF, the substrate platforms PASS8, PASS9 and the cooling unit CP.

(2) Operation of the Substrate Processing Apparatus

Next, description will be made of the operation of the substrate processing apparatus 500 according to the present embodiment while referring to FIGS. 1 to 4.

(2-1) Operation in the Indexer Block to the Development Processing Block

First, brief description will be made of the operations of the indexer block 1, the anti-reflection film processing block 2, the resist film processing block 3 and the development processing block 4.

Carriers C each storing a plurality of substrates W in multiple stages are respectively carried onto the carrier platforms 92 in the indexer block 1. The indexer robot IR takes out the unprocessed substrate W that is stored in the carrier C using the hand IRH1. Thereafter, the indexer robot IR rotates in the ±θ direction while moving in the ±X direction, and places the unprocessed substrate W on the substrate platform PASS1.

Although FOUPs (Front Opening Unified Pods) are adopted as the carriers C in the present embodiment, the present invention is not limited to this. For example, SMIF (Standard Mechanical Inter Face) pods, OCs (Open Cassettes) that expose the stored substrates W to outside air, or the like may be used.

Furthermore, although linear-type transport robots that move their hands forward and backward by linearly sliding them to the substrate W are respectively used as the indexer robot IR, the first to third central robots CR1 to CR3, and the interface transport mechanisms IFR1, IFR2, the present invention is not limited to this. For example, multi-joint type transport robots that linearly move their hands forward and backward by moving their joints may be used.

The unprocessed substrate W placed on the substrate platform PASS1 is received by the first central robot CR1 in the anti-reflection film processing block 2. The first central robot CR1 carries the substrate W in the thermal processing group 100 or 101 for anti-reflection film.

Thereafter, the first central robot CR1 takes out the substrate W after the thermal processing from the thermal processing group 100 or 101 for anti-reflection film and carries the substrate W into the coating processing group 20 for anti-reflection film. In the coating processing group 20 for anti-reflection film, the coating unit BARC forms a coating of an anti-reflection film on the substrate W in order to reduce standing waves and halation to be generated during the exposure processing.

The first central robot CR1 then takes out the substrate W after the coating processing from the coating processing group 20 for anti-reflection film and carries the substrate W into the thermal processing group 100 or 101 for anti-reflection film. Thereafter, the first central robot CR1 takes out the substrate W after the thermal processing from the thermal processing group 100 or 101 for anti-reflection film and places the substrate W on the substrate platform PASS3.

The substrate W placed on the substrate platform PASS3 is received by the second central robot CR2 in the resist film processing block 3. The second central robot CR2 carries the substrate W into the thermal processing group 110 or 111 for resist film.

Thereafter, the second central robot CR2 takes out the substrate W after the thermal processing from the thermal processing group 110 or 111 for resist film and carries the substrate W into the coating processing group 30 for resist film. In the coating processing group 30 for resist film, the coating unit RES forms a coating of a resist film on the substrate W that has been coated with the anti-reflection film.

The second central robot CR2 then takes out the substrate W after the coating processing from the coating processing group 30 for resist film and carries the substrate W into the thermal processing group 110 or 111 for resist film. Thereafter, the second central robot CR2 takes out the substrate W after the thermal processing from the thermal processing group 110 or 111 for resist film and places the substrate W on the substrate platform PASS5.

The substrate W placed on the substrate platform PASS5 is received by the third central robot CR3 in the development processing block 4. The third central robot CR3 places the substrate W on the substrate platform PASS7.

The substrate W placed on the substrate platform PASS7 is received by the interface transport mechanism IFR2 in the interface block 5 through the connection opening 121b of FIG. 4, and is subjected to given processing in the interface block 5 and the exposure device 6, as described below. After the substrate W is subjected to the given processing in the interface block 5 and the exposure device 6, the interface transport mechanism IFR2 carries the substrate W into the thermal processing group 121 for post-exposure bake in the development processing block 4 of FIG. 1 through the connection opening 121b.

In the thermal processing group 121 for post-exposure bake, the substrate W is subjected to post-exposure bake (PEB). Thereafter, the third central robot CR3 in the development processing block 4 takes out the substrate W from the thermal processing group 121 for post-exposure bake, and carries the substrate W into the development processing group 40. In the development processing group 40, the substrate W after the exposure processing is subjected to development processing.

The third central robot CR3 then takes out the substrate W after the development processing from the development processing group 40 and carries the substrate W into the thermal processing group 120 for development. The third central robot CR3 subsequently takes out the substrate W after the thermal processing from the thermal processing group 120 for development, and places the substrate W on the substrate platform PASS6.

The substrate W placed on the substrate platform PASS6 is placed on the substrate platform PASS4 by the second central robot CR2 in the resist film processing block 3.

The substrate W placed on the substrate platform PASS4 is placed on the substrate platform PASS2 by the first central robot CR1 in the anti-reflection film processing block 2.

The substrate W placed on the substrate platform PASS2 is stored in the carrier C by the indexer robot IR in the indexer block 1. Thus, the processing on the substrate W is finished in the substrate processing apparatus 500.

(2-2) Schematic Operation of the Interface Block

Details of the operation of the interface block 5 will be then described.

As described in the foregoing, the substrate W carried in the indexer block 1 is subjected to the given processing, and then placed on the substrate platform PASS7 in the development processing block 4 (see FIG. 1).

Figure 4:
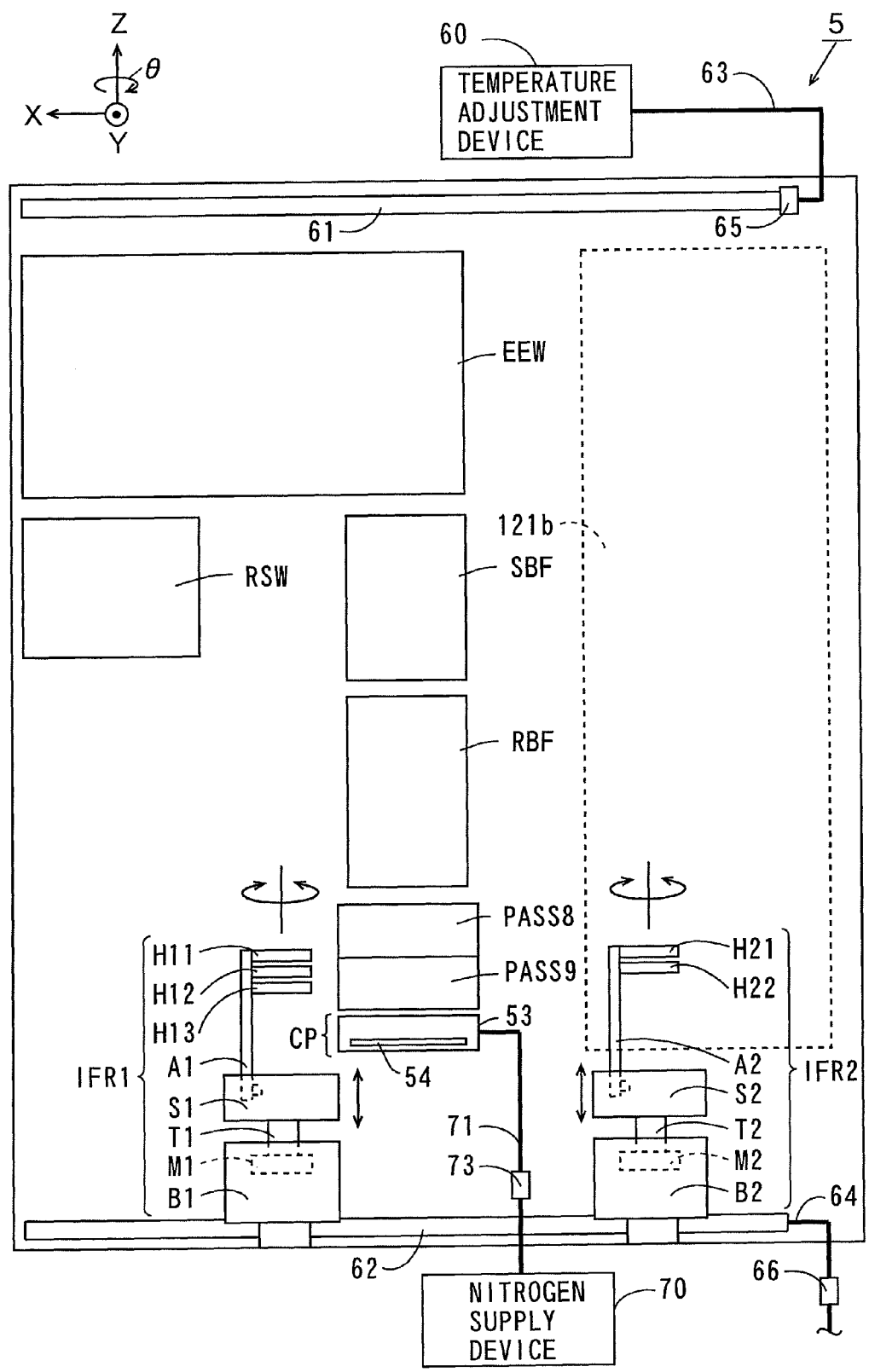
FIG. 4 is a schematic side view of an interface block viewed from an exposure device.

The interface transport mechanism IFR2 of FIG. 4 takes out the substrate W from the substrate platform PASS7 and transports the substrate W to the edge exposure unit EEW through the connection opening 121b using the hand H21. The edge of the substrate W is subjected to exposure processing in the edge exposure unit EEW.

The interface transport mechanism IFR2 takes out the substrate W whose edge has been subjected to the exposure processing from the edge exposure unit EEW and transports the substrate W to substrate platform PASS8 using the hand H22.

At this time, when processing speed of the exposure device 6 is not sufficiently high, the substrate W before the exposure processing may exist on the substrate platform PASS8. In this case, the interface transport mechanism IFR2 may transport the substrate W taken out from the edge exposure unit EEW to the sending buffer unit SBF using the hand H22. The substrate W is temporarily stored in the sending buffer unit SBF. After the substrate W before the exposure processing is transported from the substrate platform PASS8 to the back surface cleaning processing unit RSW, the interface transport mechanism IFR2 takes out the substrate W from the sending buffer unit SBF and transports the substrate W to the substrate platform PASS8 using the hand H22 as described below.

The substrate W after the exposure processing is placed on the substrate platform PASS9 as described below. The hand H22 of the interface transport mechanism IFR2 takes out the substrate W from the substrate platform PASS9, and transports the substrate W to the heating unit HP (see FIG. 1) of the thermal processing group 121 for post-exposure bake in the development processing block 4 through the connection opening 121b.

Here, when the thermal processing group 121 for post-exposure bake is temporarily not capable of receiving the substrate W, the interface transport mechanism IFR2 may take out the substrate W from the substrate platform PASS9 and transport the substrate W to the return buffer unit RBF using the hand H22. In this case, the substrate W is temporarily stored in the return buffer unit RBF. After the thermal processing group 121 for post-exposure bake becomes capable of receiving the substrate W, the interface transport mechanism IFR2 takes out the substrate W from the return buffer unit RBF and transports the substrate W into the thermal processing group 121 for post-exposure bake through the connection opening 121b using the hand H22.

The interface transport mechanism IFR2 may transport the substrate W from the substrate platform PASS9 to the thermal processing group 121 for post-exposure bake using the hand H21 instead of the hand H22.

The interface transport mechanism IFR2 repeats the foregoing operations. Accordingly, processes of transporting the substrate W from the substrate platform PASS7 of FIG. 1 to the edge exposure unit EEW, transporting the substrate W from the edge exposure unit EEW to the substrate platform PASS8 and transporting the substrate W from the substrate platform PASS9 to the heating unit HP of the thermal processing group 121 for post-exposure bake are repeated.

Meanwhile, the interface transport mechanism IFR1 takes out the substrate W from the substrate platform PASS8 and transports the substrate W to the back surface cleaning processing unit RSW using the hand H13. The back surface cleaning processing of the substrate W before the exposure processing is performed in the back surface cleaning processing unit RSW as described above.

The interface transport mechanism IFR1 takes out the substrate W after the back surface cleaning processing and the drying processing from the back surface cleaning processing unit RSW, and transports the substrate W to the cooling unit CP using the hand H12. The substrate W transported to the cooling unit CP is adjusted to the same temperature as that in the inside of the exposure device 6 or a temperature (20 to 23° C., for example) that is higher than that in the inside of the exposure device 6. The substrate W is adjusted to the same temperature as that in the inside of the exposure device 6, thereby preventing the substrate W from being deformed at the time of being carried in the exposure device 6 due to a difference in temperature between the inside and outside of the exposure device 6. When the temperature of the substrate W decreases in the exposure device 6, the substrate W is adjusted to a temperature higher than the temperature in the inside of the exposure device 6, so that the substrate W can be prevented from being deformed at the time of being carried in the exposure device 6 due to a difference in temperature between the inside and outside of the exposure device 6.

The inside of the cooling unit CP is filled with dry nitrogen gas. The substrate W is dried in the atmosphere of dry nitrogen gas, so that moisture adhering to the substrate W is sufficiently removed. Details will be described below.

The interface transport mechanism IFR1 takes out the substrate W which is maintained at the given temperature and from which moisture has been removed by the dry nitrogen gas from the cooling unit CP, and transports the substrate W to a substrate carry-in section 6a (see FIG. 1) in the exposure device 6 using the hand H11. The substrate W is subjected to the exposure processing in the exposure device 6.

As described above, the different hands H11, H12 are used for holding and transporting the substrate W from the back surface cleaning processing unit RSW to the cooling unit CP and for holding and transporting the substrate W from the cooling unit CP to the exposure device 6. Thus, the temperature of the hand H11 holding the substrate W whose temperature has been adjusted is kept constant. This prevents the temperature of the substrate W from changing when the substrate W is transported from the cooling unit CP to the exposure device 6.

The interface transport mechanism IFR1 takes out the substrate W after the exposure processing from a substrate carry-out section 6b (see FIG. 1) of the exposure device 6, and transports the substrate W to the substrate platform PASS9 using the hand H13.

The interface transport mechanism IFR1 repeats the foregoing operations. Accordingly, processes of transporting the substrate W from the substrate platform PASS8 to the back surface cleaning processing unit RSW, transporting the substrate W from the back surface cleaning processing unit RSW to the cooling unit CP, transporting the substrate W from the cooling unit CP to the substrate carry-in section 6a of the exposure device 6 and transporting the substrate W from the substrate carry-out section 6b of the exposure device 6 to the substrate platform PASS9 are repeated.

(3) The Back Surface Cleaning Processing Unit

Next, description will be made of details of the back surface cleaning processing unit RSW.

(3-1) The Configuration

Figure 5:
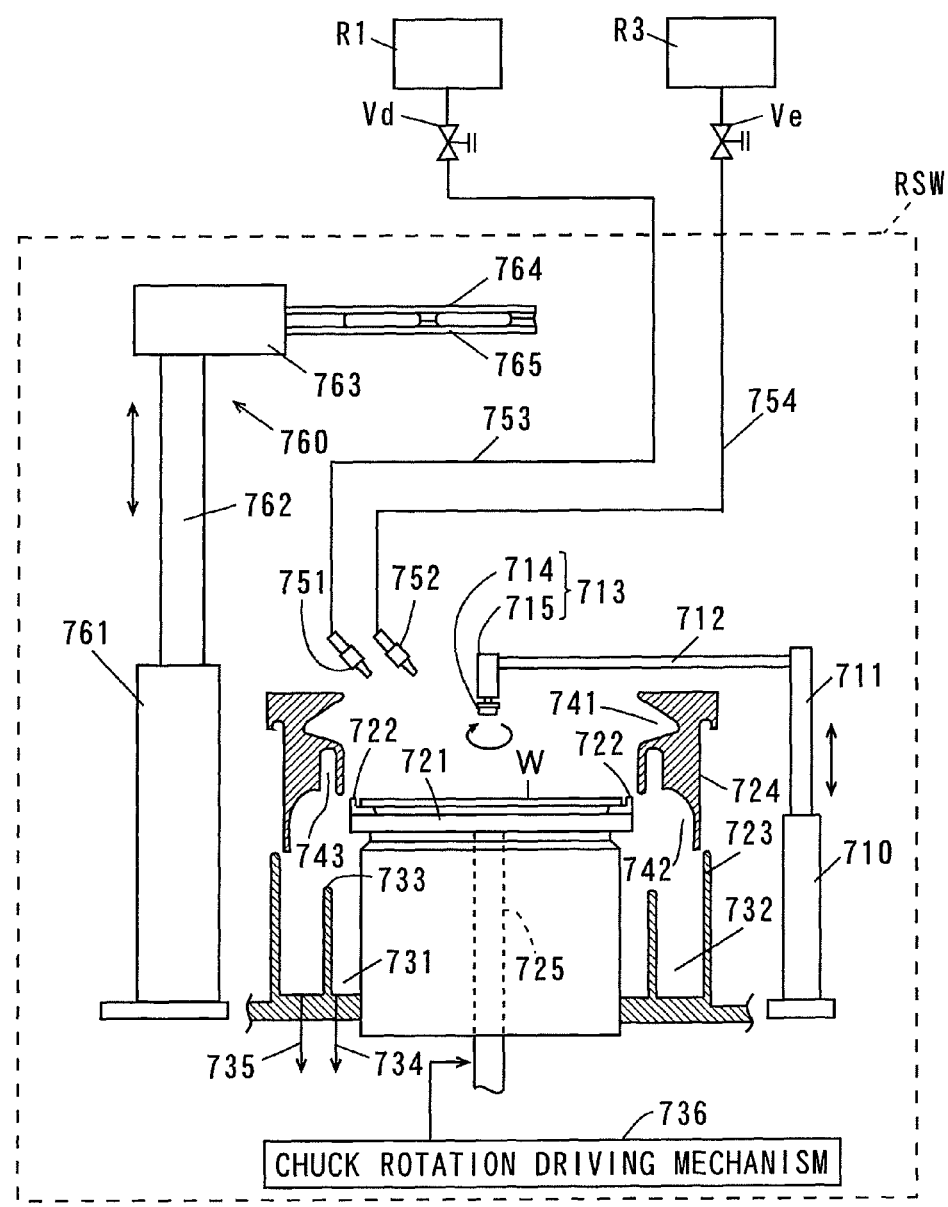
FIG. 5 is a diagram for use in illustrating the configuration of a back surface cleaning processing unit.

FIG. 5 is a diagram for use in illustrating the configuration of the back surface cleaning processing unit RSW.

As shown in FIG. 5, the back surface cleaning processing unit RSW includes a spin chuck 721 for holding the substrate W horizontally and rotating the substrate W around the vertical rotation axis passing through the center of the substrate W. In the back surface cleaning processing unit RSW, the spin chuck 721 holds an end surface of the substrate W by a plurality of holding pins 722. The spin chuck 721 is fixed to an upper end of a lifting shaft 725 rotated by a chuck rotation driving mechanism 736.

An arm driving device 710 is provided outside the spin chuck 721. A lifting shaft 711 is connected to the arm driving device 710. Furthermore, an arm 712 is coupled to the lifting shaft 711 so as to extend in the horizontal direction, and its tip is provided with a brushing device 713. The brushing device 713 includes a brush 714 that is directed downward, and a brushing motor 715 that rotates the brush 714.

The arm driving device 710 causes the lifting shaft 711 to rotate while causing the arm 712 to swing. This causes the brushing device 713 to move to a position above the substrate W held on the spin chuck 721. The arm driving device 710 moves the lifting shaft 711 and the arm 712 up and down, and the brush 714 of the brushing device 713 moves in a direction closer to or away from the substrate W.

A substrate reversing device 760 is provided outside the spin chuck 721. The substrate reversing device 760 includes a lifting driving device 761. A lifting shaft 762 is provided in the lifting driving device 761, and a chuck opening/closing device 763 is attached to an upper end of the lifting shaft 762. A pair of chucks 764, 765 for holding the substrate W is attached to the chuck opening/closing device 763.

The lifting shaft 762 is moved in a vertical direction by the lifting driving device 761. As the lifting shaft 762 moves, the chucks 764, 765 move in the vertical direction between a position at the same height as the substrate W on the spin chuck 721 (hereinafter referred to as a substrate holding position) and a position above the spin chuck 721 (hereinafter referred to as a substrate reversing position). The substrate reversing device 760 can reverse the substrate W 180 degrees at the substrate reversing position. Details of the substrate reversing device 760 will be described below.

Outside the spin chuck 721, a cleaning liquid supply nozzle 751 and an inert gas supply nozzle 752 are provided in respective positions in an obliquely upward direction from the spin chuck 721. The cleaning liquid supply nozzle 751 and the inert gas supply nozzle 752 are arranged so as not to inhibit the substrate reversing device 760 from moving up and down. The cleaning liquid supply nozzle 751 is connected to a cleaning liquid supply source R1 through a cleaning liquid supply pipe 753 and a valve Vd. The inert gas supply nozzle 752 is connected to an inert gas supply source R3 through an inert gas supply pipe 754 and a valve Ve.

An amount of a cleaning liquid supplied to the cleaning liquid supply pipe 753 can be adjusted by controlling the opening/closing of the valve Vd. The cleaning liquid is supplied from the cleaning liquid supply source R1 to the cleaning liquid supply nozzle 751 through the cleaning liquid supply pipe 753. This allows the cleaning liquid to be supplied onto the substrate W. Examples of the cleaning liquid include pure water, a pure water solution containing a complex (ionized), or a fluorine-based chemical solution.

An amount of inert gas supplied to the inert gas supply pipe 754 can be adjusted by controlling the opening/closing the valve Ve. The inert gas is supplied from the inert gas supply source R3 to the inert gas supply nozzle 752 through the inert gas supply pipe 754. This allows the inert gas to be supplied onto the substrate W. Examples of the inert gas include nitrogen gas.

The substrate W held on the spin chuck 721 is housed in a processing cup 723. A cylindrical partition wall 733 is provided inside the processing cup 723. A liquid discharge space 731 for discharging the cleaning liquid used for processing the substrate W is formed so as to surround the spin chuck 721. Further, a liquid recovery space 732 for recovering the cleaning liquid used for the back surface cleaning processing of the substrate W is formed between the processing cup 723 and the partition wall 733 so as to surround the liquid discharge space 731.

A liquid discharge pipe 734 for introducing the cleaning liquid into a liquid discharge processing device (not shown) is connected to the liquid discharge space 731. A recovery pipe 735 for introducing the cleaning liquid into a recovery processing device (not shown) is connected to the liquid recovery space 732.

A guard 724 is provided above the processing cup 723 for preventing the cleaning liquid on the substrate W from being splashed outward. The guard 724 is shaped to be rotationally-symmetric with respect to the lifting shaft 725. An annular-shaped liquid discharge guide groove 741 with a V-shaped cross section is formed inwardly at an upper end of the guard 724.

Furthermore, a liquid recovery guide 742 having an inclined surface that is inclined outwardly downward is formed inwardly at a lower end of the guard 724. A partition wall housing groove 743 for receiving the partition wall 733 in the processing cup 723 is formed in the vicinity of an upper end of the liquid recovery guide 742.

This guard 724 is provided with a guard lifting driving mechanism (not shown) composed of a ball-screw mechanism and so on. The guard lifting driving mechanism moves the guard 724 up and down.

Here, the cleaning liquid splashed outward from the substrate W is introduced to the liquid recovery space 732 by the liquid recovery guide 742 and recovered through the recovery pipe 735 when the liquid recovery guide 742 is opposite to an outer circumference of the substrate W held on the spin chuck 721 (in a state of the guard 724 shown in FIG. 5). Hereinafter, such a position of the guard 724 is referred to as a recovery position.

The cleaning liquid splashed outward from the substrate W is introduced to the liquid discharge space 731 by the liquid discharge guide groove 741 and discharged through the liquid discharge pipe 734 when the liquid discharge guide groove 741 is opposite to the outer circumference of the substrate W held on the spin chuck 721. Hereinafter, such a position of the guard 724 is referred to as a liquid discharge position.

When the substrate W on the spin chuck 721 is carried in or out, the height of the upper end of the guard 724 is lower than the height of the substrate W held on the spin chuck 721. Hereinafter, such a position of the guard 724 is referred to as a carry-in/out position.

The guard 724 moves up and down between the carry-in/out position and the liquid discharge position in the present embodiment.

(3-2) Details of the Substrate Reversing Device

Figure 6:
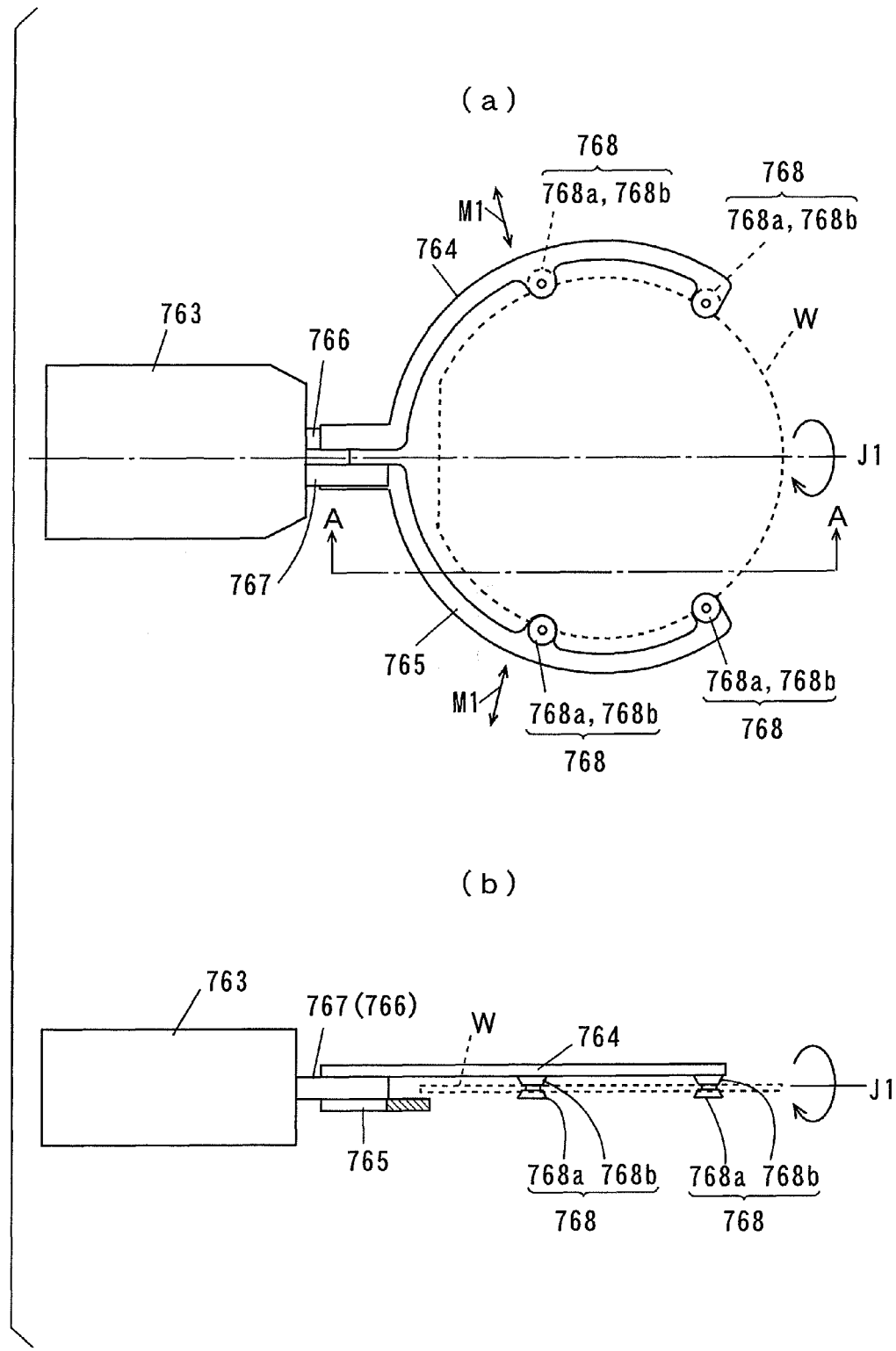
FIG. 6 (a) is a top view of a chuck opening/closing device and chucks shown in FIG. 5.

Description will be made of details of the chuck opening/closing device 763 and the chucks 764, 765 of the substrate reversing device 760. FIG. 6 (a) is a top view of the chuck opening/closing device 763 and the chucks 764, 765 shown in FIG. 5, and FIG. 6 (b) is a sectional view of the chuck opening/closing device 763 and the chucks 764, 765 shown in FIG. 6 (a) taken along the line A-A.

As shown in FIG. 6 (a), each of the chucks 764, 765 has a substantially circular arc shape along the end surface of the substrate W. The chucks 764, 765 are arranged symmetrically with each other with the substrate W therebetween, and slightly shifted in the vertical direction as shown in FIG. 6 (b). Two support members 768 are provided to project from one surface (a lower surface in FIG. 6 (b)) of the chuck 764, and two support members 768 are provided to project from one surface (an upper surface in FIG. 6 (b)) of the chuck 765. Each of the support members 768 is composed of a support portion 768a in the shape of a circular truncated cone and a support portion 768b in the shape of an inverted circular truncated cone that are integrally formed. A groove is formed between the support portions 768a, 768b, and the end surface of the substrate W is held by the groove. Each support member 768 is made of fluororesin, for example.

The chucks 764, 765 are connected to the chuck opening/closing device 763 through respective supports 766, 767. The chucks 764, 765 are moved by the chuck opening/closing device 763 in directions closer to and away from each other (see the arrow M1 of FIG. 6 (a)). Hereinafter, a state where the chucks 764, 765 are farthest away from each other is referred to as an open state.

The chuck opening/closing device 763 includes a motor that is not shown, and is capable of rotating 180 degrees the chucks 764, 765 around an axial center J1 extending in a horizontal direction.

(3-3) Operation

Description will be made of the processing operation of the back surface cleaning processing unit RSW having the above-described configuration. Operations of components in the back surface cleaning processing unit RSW described below are controlled by the main controller (control unit) 91 of FIG. 1.

At the time of carrying in the substrate W, the guard 724 moves to the foregoing carry-in/out position and the interface transport mechanism IFR1 (the interface transport mechanism IFR2 in a second embodiment described below) of FIG. 1 places the substrate W on the spin chuck 721. At this time, the top surface of the substrate W is directed upward.

Next, the chucks 764, 765 in the open state are lowered to the foregoing substrate holding position. The chucks 764, 765 are then moved in the direction closer to each other by the chuck opening/closing device 763. Thus, the support members 768 of the chucks 764, 765 abut against the end surface of the substrate W, and the substrate W is held by the chucks 764, 765.

The chucks 764, 765 are subsequently lifted to the foregoing substrate reversing position. The chucks 764, 765 are rotated 180 degrees by the chuck opening/closing device 763. Thus, the substrate W is reversed, and the back surface of the substrate W is directed upward.

Next, the chucks 764, 765 are lowered to the substrate holding position while keeping the foregoing state. The chucks 764, 765 are then brought into the open state. This causes the substrate W to be placed on the spin chuck 721 with its back surface directed upward. The end surface of the substrate W is subsequently held by the holding pins 722. Meanwhile, the chucks 764, 765 are retracted to a position above the substrate W.

The guard 724 then moves to the foregoing liquid discharge position while the lifting shaft 725 rotates. The substrate W held on the spin chuck 721 rotates according to the rotation of the lifting shaft 725. At this time, the brush 714 moves to a position above the center of the substrate W.

Next, the cleaning liquid is discharged from the cleaning liquid supply nozzle 751 onto the back surface of the substrate W, and the brush 714 is lowered while rotating to abut against the back surface of the substrate W. Accordingly, the back surface of the substrate W is cleaned by the brush 714.

After an elapse of a given period of time, the supply of the cleaning liquid is stopped and the brush 714 moves outward from the substrate W. Then, the number of rotations of the lifting shaft 725 is increased. This causes the cleaning liquid on the substrate W to be removed by a centrifugal force.

The inert gas is subsequently discharged from the inert gas supply nozzle 752 onto the back surface of the substrate W. Accordingly, the back surface of the substrate W is reliably dried. The supply of the inert gas is stopped, and the rotation of the lifting shaft 725 is stopped after an elapse of a given period of time. The guard 724 moves to the carry-in/out position.

The substrate W held on the spin chuck 721 is then released, and the substrate W is held by the chucks 764, 765 of the substrate reversing device 760, and the substrate W is again reversed in the substrate reversing position, similarly to the foregoing. This causes the top surface of the substrate W to be directed upward.

Then, the substrate W is placed on the spin chuck 721, and carried from the back surface cleaning processing unit RSW by the hand H12 of the interface transport mechanism IFR1 of FIG. 1 (the hand H21 of the interface transport mechanism IFR2 in the second embodiment described below). Accordingly, the back surface cleaning processing and the drying processing of the substrate W in the back surface cleaning processing unit RSW are finished. It is preferable that the position of the guard 724 during the back surface cleaning processing and the drying processing is suitably changed according to the necessity to recover or discharge the cleaning liquid.

A rinse liquid may be supplied onto the back surface of the substrate W after the back surface of the substrate W is cleaned by the brush 714. Any of pure water, carbonated water, hydrogen water, electrolytic ionic water and HFE (hydrofluoroether) is used as the rinse liquid, for example. In this case, the cleaning liquid is washed away by the rinse liquid, thus more reliably preventing the cleaning liquid from remaining on the substrate W.

While the cleaning liquid supply nozzle 751 and the inert gas supply nozzle 752 are fixed in the back surface cleaning processing unit RSW in the present embodiment, the nozzles 751 and 752 may be attached to an arm that is swung by a motor. In the case, a region in which the cleaning liquid is discharged or a region in which the inert gas is discharged can be easily adjusted. Therefore, the back surface cleaning processing and the drying processing of the substrate W can be effectively performed. For example, at the time of drying the back surface of the substrate W, the inert gas supply nozzle 752 is moved from the position above the center of the substrate W to a position above a peripheral edge of the substrate W, so that the inert gas can be sprayed to the entire back surface of the substrate W, and the cleaning liquid on the back surface of the substrate W can be more effectively removed.

While the back surface cleaning processing of the substrate W is performed using the brush 714 in the present embodiment, the back surface cleaning processing of the substrate W may be performed using another method such as a high-pressure injection nozzle, an ultrasonic nozzle or a twin-fluid nozzle.

While the drying processing of the substrate W is performed by a spin drying method in the present embodiment, the drying processing of the substrate W may be performed by another drying method such as a reduced-pressure drying method or an air knife drying method.

While the substrate W is reversed by the substrate reversing device 760 and subjected to the back surface cleaning processing in the present embodiment, the back surface cleaning processing of the substrate W may be performed without reversing the substrate W by providing a nozzle that discharges the cleaning liquid toward the substrate W from below or a brush that abuts against the substrate W from below.

(4) Adjustment of Amount of Moisture Adhering to the Substrate

As shown in FIG. 4, an air supply unit 61 for supplying clean air is provided at the top in the interface block 5. An air discharge unit 62 for discharging the atmosphere is provided at the bottom in the interface block 5.

The air supply unit 61 is connected to a temperature adjustment device 60 through a flow pipe 63. The temperature adjustment device 60 adjusts the temperature and humidity of the air to preset values, and removes impurities such as particles (dust) in the air. The air adjusted and purified in the temperature adjustment device 60 is supplied to the air supply unit 61 through the flow pipe 63. Accordingly, clean air whose temperature and humidity are adjusted is supplied from the air supply unit 61 to the interface block 5.

In this manner, the clean air whose temperature and humidity are adjusted is supplied to the interface block 5 by the temperature adjustment device 60, thus allowing the substrate W before the post-exposure bake to hold an appropriate amount of moisture. Accordingly, a catalytic reaction on the substrate W is appropriately promoted in the thermal processing group 121 for post-exposure bake.

A flow rate adjustment damper 65 is provided in a connection portion between the air supply unit 61 and the flow pipe 63. The flow rate adjustment damper 65 adjusts the flow rate of the air flowing from the flow pipe 63 to the air supply unit 61.

A flow pipe 64 is connected to the air discharge unit 62. The air in the interface block 5 is discharged to the outside through the air discharge unit 62 and the flow pipe 64. Thus, the atmosphere in the interface block 5 is maintained in the clean state with the appropriate temperature and humidity.

A flow rate adjustment damper 66 is provided in the flow pipe 64. The flow rate adjustment damper 66 adjusts the flow rate of the air in the flow pipe 64.

The cooling unit CP in the interface block 5 is composed of a casing 53 and a cooling plate 54. The cooling plate 54 is arranged within the casing 53. The casing 53 of the cooling unit CP is connected to a nitrogen supply device 70 through a flow pipe 71. Dry nitrogen gas is supplied from the nitrogen supply device 70 to the casing 53 of the cooling unit CP through the flow pipe 71. Thus, the inside of the casing 53 of the cooling unit CP is filled with the dry nitrogen gas.

In this case, the substrate W transported to the cooling unit CP is dried in an atmosphere of the dry nitrogen gas, so that moisture adhering to the substrate W is sufficiently removed before the exposure processing. As a result, even when the substrate W is transported to the vacuum exposure device, a degree of vacuum in the vacuum exposure device is reliably prevented from being lowered.

A flow rate adjustment damper 73 is provided in the flow pipe 71. The flow rate adjustment damper 73 adjusts the flow rate of air in the flow pipe 71.

According to the above-described configuration, the substrate W before the exposure processing can be sufficiently dried and the amount of moisture in the resist film on the substrate W before the post-exposure bake can be appropriately adjusted while an increase in processing cost of the substrate W can be suppressed.

(5) Details of the Operations of the Interface Transport Mechanisms

Figure 7:
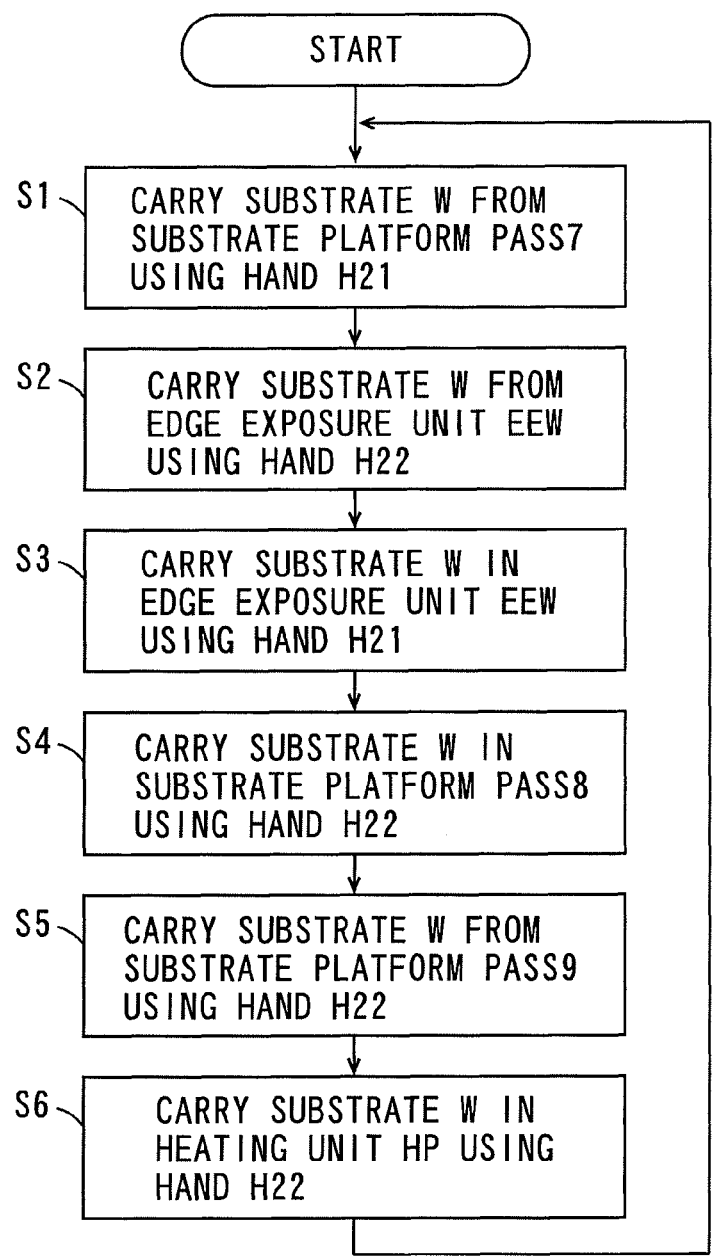
FIG. 7 is a flowchart showing operations of hands of an interface transport mechanism.
Figure 8:
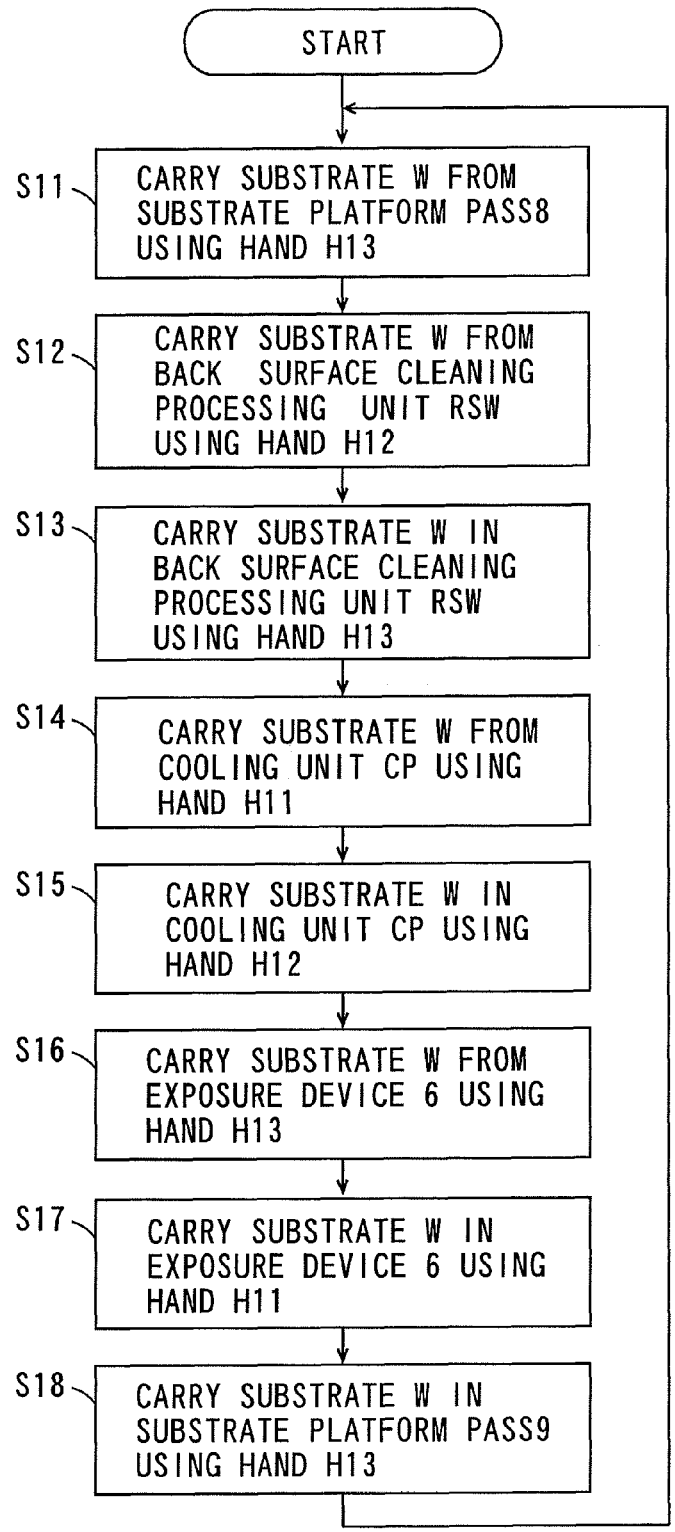
FIG. 8 is a flowchart showing operations of hands of an interface transport mechanism.
Figure 9:
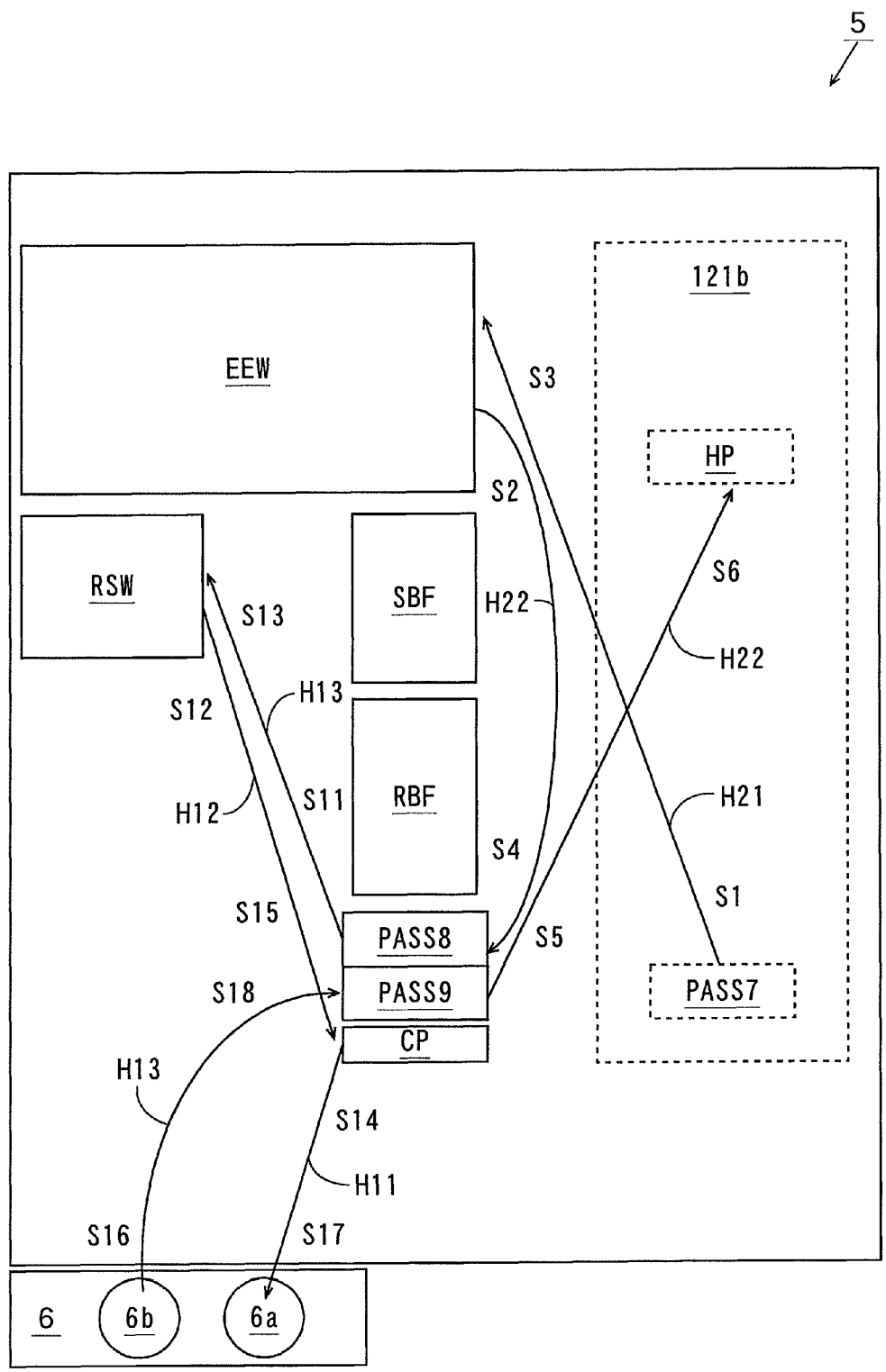
FIG. 9 is a diagram showing a transport path of a substrate in the interface block.

Description will be made of details of the operations of the interface transport mechanisms IFR1, IFR2. FIG. 7 is a flowchart showing the operations of the hands H21, H22 of the interface transport mechanism IFR2, FIG. 8 is a flowchart showing the operations of the hands H11 to H13 of the interface transport mechanism IFR1, and FIG. 9 is a diagram showing a transport path of the substrate W in the interface block 5. The hands H21, H22 of the interface transport mechanism IFR2 and the hands H11 to H13 of the interface transport mechanism IFR1 are controlled by the main controller (control unit) 91.

As shown in FIGS. 7 and 9, the interface transport mechanism IFR2 carries the substrate W from the substrate platform PASS 7 of the thermal processing group 121 for post-exposure bake (see FIG. 4) using the hand H21 (Step S1).

The interface transport mechanism IFR2 carries the substrate W from the edge exposure unit EEW using the hand H22 (Step S2). This allows the substrate W to be carried in the edge exposure unit EEW. The interface transport mechanism IFR2 then carries the substrate W held by the hand H21 in the edge exposure unit EEW (Step S3).

The interface transport mechanism IFR1 carries the substrate W from the substrate platform PASS8 using the hand H13 (Step S11 of FIG. 8) as described below. This allows the substrate W to be carried in the substrate platform PASS8. Next, the interface transport mechanism IFR2 carries the substrate W held by the hand H22 in the substrate platform PASS8 (Step S4).

The interface transport mechanism IFR1 carries the substrate W in the substrate platform PASS9 using the hand H13 (Step S18 of FIG. 8) as described below. The interface transport mechanism IFR2 subsequently carries the substrate W from the substrate platform PASS9 using the hand H22 (Step S5). Then, the interface transport mechanism IFR2 carries the substrate W held by the hand H22 in the heating unit HP of the thermal processing group 121 for post-exposure bake (see FIG. 4) (Step S6). The main controller (control unit) 91 controls the interface transport mechanism IFR2 to repeat the processes of Steps S1 to S6.

As shown in FIGS. 8 and 9, the interface transport mechanism IFR1 carries the substrate W from the substrate platform PASS8 using the hand H13 (Step S11).

The interface transport mechanism IFR1 carries the substrate W from the back surface cleaning processing unit RSW using the hand H12 (Step S12). This allows the substrate W to be carried in the back surface cleaning processing unit RSW. Then, the interface transport mechanism IFR1 carries the substrate W held by the hand H13 in the back surface cleaning processing unit RSW (Step S13).

The interface transport mechanism IFR1 carries the substrate W from the cooling unit CP using the hand H11 (Step S14). This allows the substrate W to be carried in the cooling unit CP. Next, the interface transport mechanism IFR1 carries the substrate W held by the hand H12 in the cooling unit CP (Step S15).

The interface transport mechanism IFR1 carries the substrate W from the substrate carry-out section 6b of the exposure device 6 using the hand H13 (Step S16). The interface transport mechanism IFR1 subsequently carries the substrate W held by the hand H11 in the substrate carry-in section 6a of the exposure device 6 (Step S17).

As described above, the interface transport mechanism IFR2 carries the substrate W from the substrate platform PASS9 using the hand H22 (Step S5 of FIG. 7). This allows the substrate W to be carried in the substrate platform PASS9. The interface transport mechanism IFR1 then carries the substrate W held by the hand H13 in the substrate platform PASS9 (Step S18). The main controller (control unit) 91 controls the interface transport mechanism IFR1 to repeat the processes of Steps S11 to S18.

(6) Effects

In the present embodiment, the substrate W is transported from the back surface cleaning processing unit RSW to the cooling unit CP by the hand H12 of the interface transport mechanism IFR1, the substrate W is transported from the cooling unit CP to the exposure device 6 by the hand H11 of the interface transport mechanism IFR1, and the substrate W is transported from the exposure device 6 to the substrate platform PASS9 by the hand H13.

Therefore, even when contaminants adhere to the substrate W after the exposure processing, the contaminants will not adhere to the hands H11, H12 of the interface transport mechanism IFR1 that hold the substrate W after the back surface cleaning. This allows the substrate W in the clean state after the back surface cleaning to be carried in the exposure device 6. As a result, the inside of the exposure device 6 can be prevented from being contaminated. Accordingly, even when the exposure processing is performed in vacuum in the exposure device 6, a degree of vacuum is prevented from being lowered due to the contaminants.

When the inside of the exposure device 6 is contaminated, a cleanup operation is required in order to remove the contaminants from the exposure device 6. In the case, the pressure inside the exposure device 6 is returned to atmospheric pressure, and then reduced after the cleanup operation of the exposure device 6 is finished, so that the inside of the exposure device 6 is evacuated. In the present embodiment, the inside of the exposure device 6 is less contaminated, thus requiring a less frequent cleanup operation of the exposure device 6. Even when the cleanup operation of the exposure device 6 is performed, working period of time for removing the contaminants is reduced since the inside of the exposure device 6 is less contaminated. In addition, the inside of the exposure device 6 is exposed to the air in a shorter period of time, thus shortening a period of time for reducing the pressure and evacuating the inside of the exposure device 6. This prevents a lower operation rate of the substrate processing apparatus.

The hand H11 of the interface transport mechanism IFR1 is arranged above the hand H12, and the hand H12 of the interface transport mechanism IFR1 is arranged above the hand H13. When the liquid such as the rinse liquid remains on the substrate W after the back surface cleaning, the liquid may drop from the substrate W after the back surface cleaning or the hand H12 of the interface transport mechanism IFR1 that holds the substrate W after the back surface cleaning. Even in such a case, the hand H11 of the interface transport mechanism IFR1 is arranged above the hand H12, so that the liquid will not adhere to the substrate W after the temperature adjustment held by the hand H11 of the interface transport mechanism IFR1. This prevents the temperature of the substrate W after the temperature adjustment from changing and prevents the substrate W having the liquid adhering thereto from being carried in the exposure device 6.

When the substrate W after the exposure processing is less clean than the substrate W before the exposure processing, the contaminants may drop from the substrate W after the exposure processing or the hand H13 of the interface transport mechanism IFR1 that holds the substrate W after the exposure processing. Even in such a case, the hands H11, H12 of the interface transport mechanism IFR1 are arranged above the hand H13, so that the contaminants will not adhere to the substrate W before the exposure processing held by the hands H11, H12 of the interface transport mechanism IFR1. This reliably prevents the substrate W to be carried in the exposure device 6 from being contaminated.

In the present embodiment, the substrate W is transported from the substrate platform PASS7 to the edge exposure unit EEW by the hand H21 of the interface transport mechanism IFR2, and the substrate W is transported from the edge exposure unit EEW to the substrate platform PASS8 by the hand H22 of the interface transport mechanism IFR2.

This allows the interface transport mechanisms IFR1, IFR2 to be concurrently operated. As a result, the clean substrate W can be carried in the exposure device 6 without reducing transport efficiency of the substrate W.

Since the substrate W after the exposure processing can be temporarily kept on standby on the substrate platform PASS9, a period of time for transporting the substrate W before the exposure processing and a period of time for transporting the substrate W after the exposure processing can be adjusted. As a result, transport efficiency of the substrate W can be improved, and a period of time from the exposure processing to the subsequent processing can be appropriately adjusted.

[2] Second Embodiment (1) Configuration of Substrate Processing Apparatus

Figure 10:
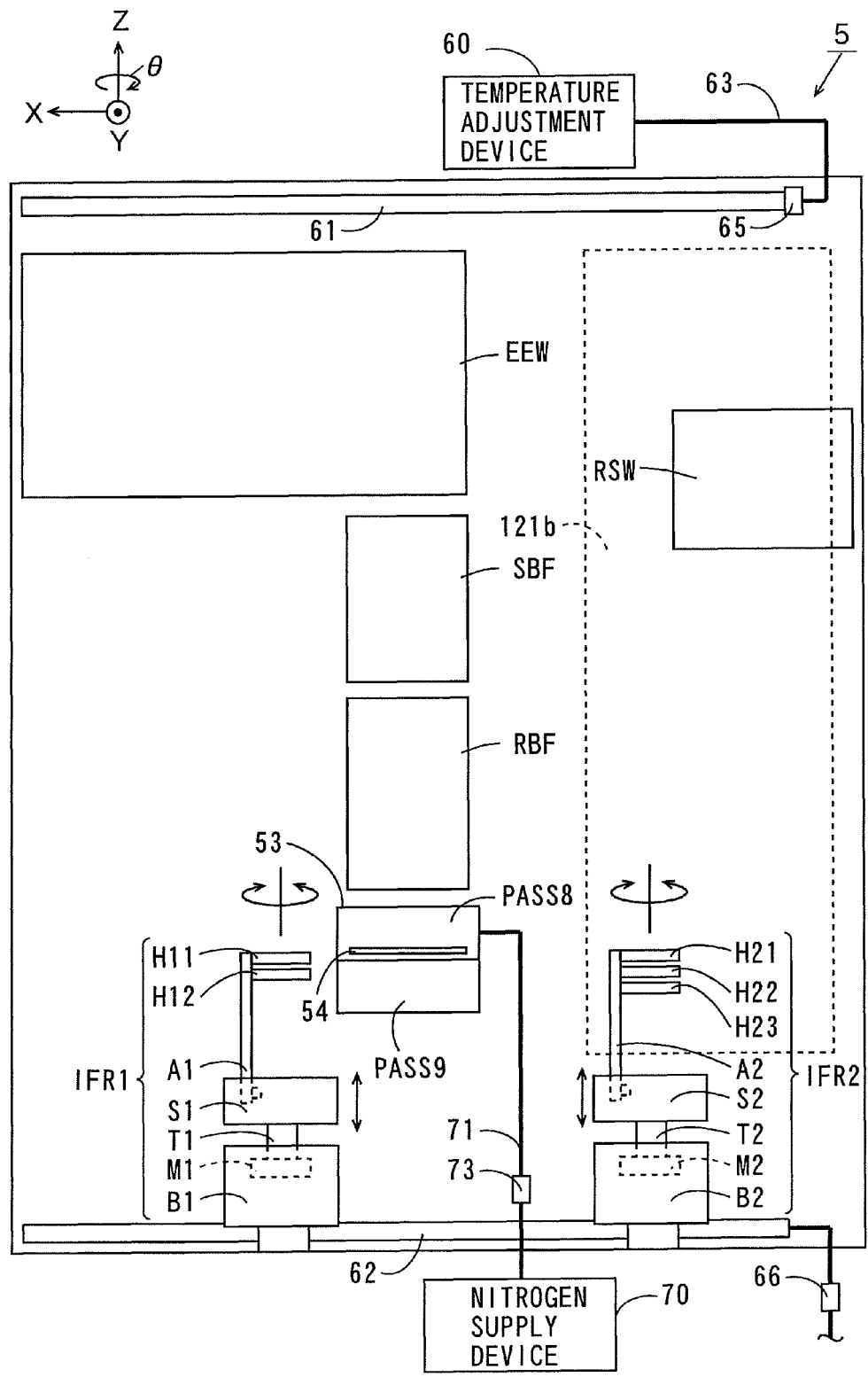
FIG. 10 is a schematic side view of an interface block viewed from the exposure device in a second embodiment.

Description will be made of a substrate processing apparatus according to a second embodiment by referring to differences from the substrate processing apparatus 500 according to the first embodiment. FIG. 10 is a schematic side view of the interface block 5 viewed from the exposure device 6 in the second embodiment. As shown in FIG. 10, the back surface cleaning processing unit RSW is arranged in an upper portion on the −X side in the interface block 5 in the present embodiment. In this case, the back surface cleaning processing unit RSW is not arranged on the +X side.

In the present embodiment, the substrate platform PASS8 includes the casing 53 and the cooling plate 54. The cooling plate 54 is arranged within the casing 53. The substrate platform PASS8 has both the functions of the substrate platform and the cooling unit. In this case, the cooling unit CP may not be separately provided.

In the interface transport mechanism IFR2, three hands H21, H22, H23 that hold the substrate W in a horizontal attitude are provided one above another in the support S2 through the arm A2 so as to be movable back and forth. Here, the hand H21 is in a position higher than the hand H22, and the hand H22 is in a position higher than the hand H23.

The two hands H11, H12 that hold the substrate W in a horizontal attitude are provided one above the other in the support 51 through the arm A1 so as to be movable back and forth in the interface transport mechanism IFR1. Here, the hand H11 is in a position higher than the hand H12. The hand H13 is not provided in the arm A1 in the present embodiment.

(2) Schematic Operation of the Interface Block

In the substrate processing apparatus 500 according to the second embodiment, the substrate W carried in the indexer block 1 is subjected to the given processing, and then placed on the substrate platform PASS7 in the development processing block 4 (see FIG. 1).

The interface transport mechanism IFR2 of FIG. 10 takes out the substrate W from the substrate platform PASS7 through the connection opening 121b and transports the substrate W to the edge exposure unit EEW using the hand H22. The exposure processing is performed on the edge of the substrate W in the edge exposure unit EEW.

The interface transport mechanism IFR2 takes out the substrate W whose edge has been subjected to the exposure processing from the edge exposure unit EEW and transports the substrate W to the back surface cleaning processing unit RSW using the hand H23. As described above, the back surface cleaning processing on the substrate W before the exposure processing is performed in the back surface cleaning processing unit RSW.

The interface transport mechanism IFR2 takes out the substrate W after the back surface cleaning processing and the drying processing from the back surface cleaning processing unit RSW and transports the substrate W to the substrate platform PASS8 using the hand H21. The substrate W transported to the substrate platform PASS8 is adjusted to the same temperature as that of the inside of the exposure device 6 or a temperature (20 to 23° C., for example) that is higher than that of the inside of the exposure device 6.

Similarly to the cooling unit CP of the interface block 5 in the first embodiment, the inside of the substrate platform PASS8 is filled with dry nitrogen gas. The substrate W is dried in the atmosphere of dry nitrogen gas, so that moisture adhering to the substrate W is sufficiently removed.

The substrate W after the exposure processing is placed on the substrate platform PASS9 as described below. The hand H23 of the interface transport mechanism IFR2 takes out the substrate W from the substrate platform PASS9, and transports the substrate W to the heating unit HP (see FIG. 1) of the thermal processing group 121 for post-exposure bake in the development processing block 4 through the connection opening 121b.

The interface transport mechanism IFR2 may transport the substrate W from the substrate platform PASS9 to the thermal processing group 121 for post-exposure bake using the hand H22 instead of the hand H23.

The interface transport mechanism IFR2 repeats the foregoing operations. Accordingly, processes of transporting the substrate W from the substrate platform PASS7 of FIG. 1 to the edge exposure unit EEW, transporting the substrate W from the edge exposure unit EEW to the back surface cleaning processing unit RSW, transporting the substrate W from the back surface cleaning processing unit RSW to the substrate platform PASS8, and transporting the substrate W from the substrate platform PASS9 to the heating unit HP of the thermal processing group 121 for post-exposure bake are repeated.

Meanwhile, the interface transport mechanism IFR1 takes out the substrate W which is maintained at the given temperature and from which moisture has been removed by the dry nitrogen gas from the substrate platform PASS8, and transports the substrate W to the substrate carry-in section 6a (see FIG. 1) in the exposure device 6 using the hand H11. The exposure processing of the substrate W is performed in the exposure device 6.

The interface transport mechanism IFR1 takes out the substrate W after the exposure processing from the substrate carry-out section 6b (see FIG. 1) in the exposure device 6, and transports the substrate W to the substrate platform PASS9 using the hand H12.

The interface transport mechanism IFR1 repeats the foregoing operations. Accordingly, processes of transporting the substrate W from the substrate platform PASS8 to the substrate carry-in section 6a of the exposure device 6 and transporting the substrate W from the substrate carry-out section 6b of the exposure device 6 to the substrate platform PASS9 are repeated.

(3) Details of the Operations of the Interface Transport Mechanisms

Figure 11:
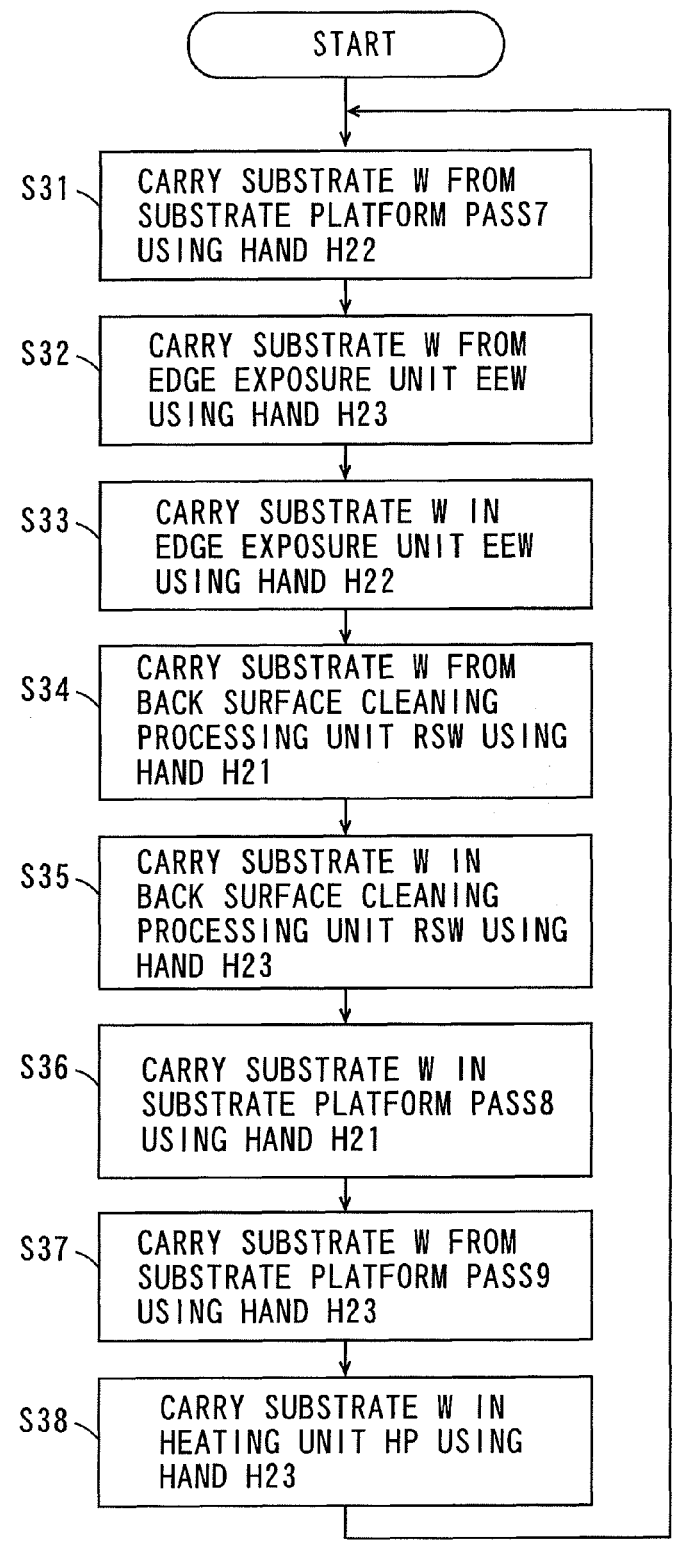
FIG. 11 is a flowchart showing operations of hands in the interface transport mechanism in the second embodiment.
Figure 12:
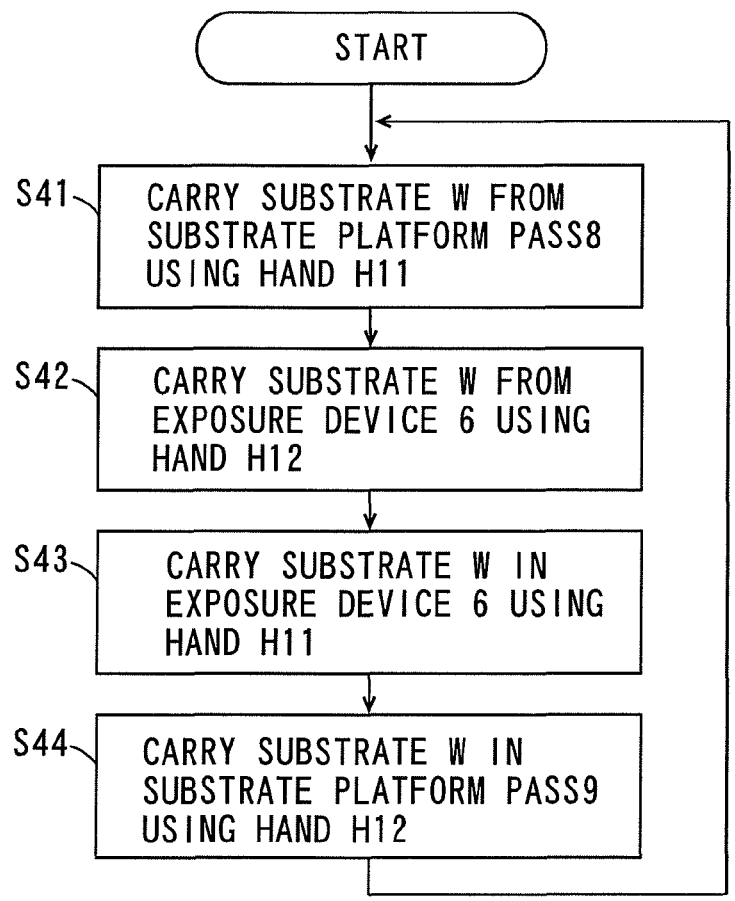
FIG. 12 is a flowchart showing operations of hands in the interface transport mechanism in the second embodiment.
Figure 13:
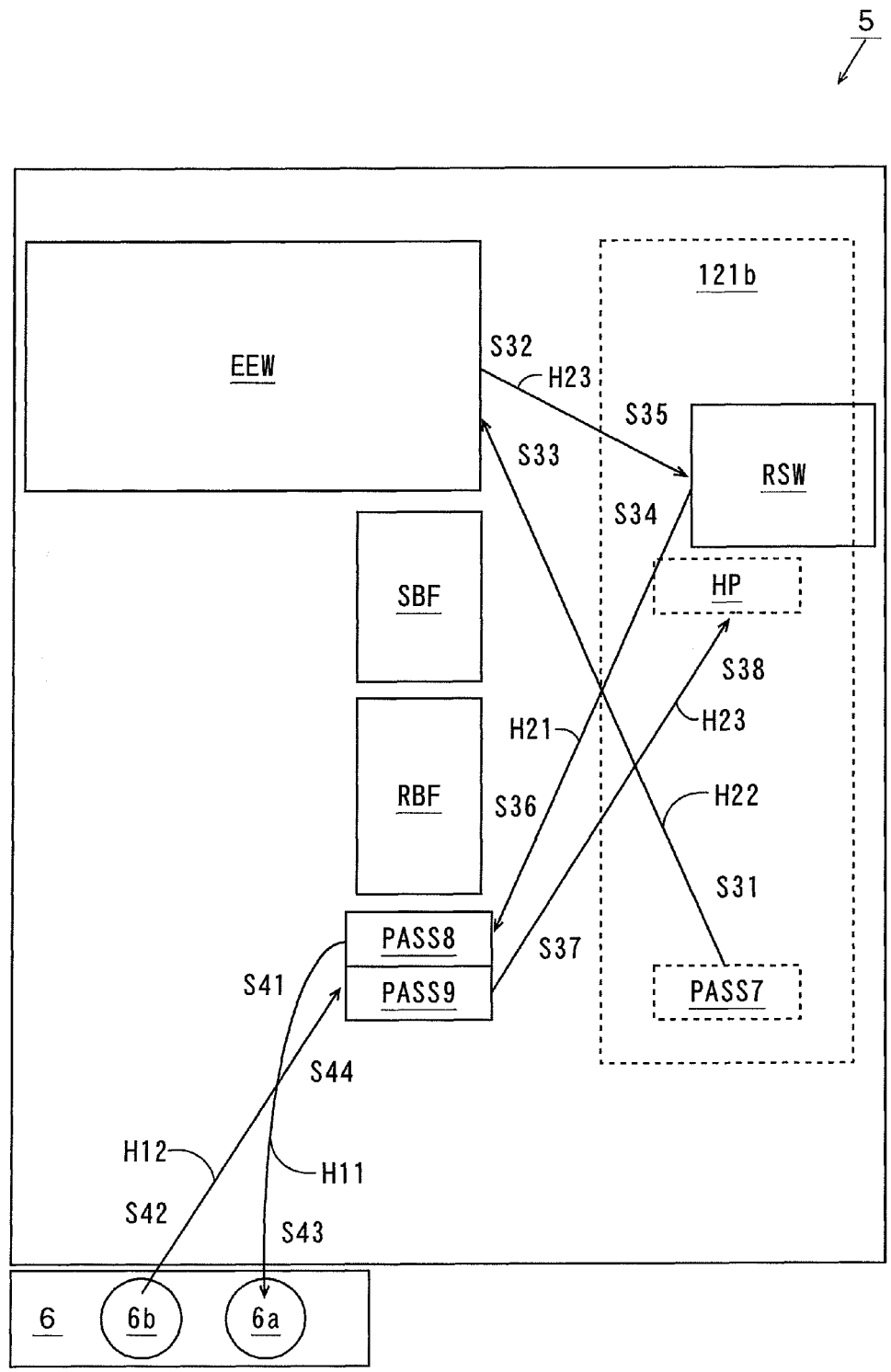
FIG. 13 is a diagram showing a transport path of the substrate in the interface block in the second embodiment.

Description will be made of details of the operations of the interface transport mechanisms IFR1, IFR2 in the second embodiment. FIG. 11 is a flowchart showing the operations of the hands H21 to H23 in the interface transport mechanism IFR2 in the second embodiment, FIG. 12 is a flowchart showing the operations of the hands H11, H12 in the interface transport mechanism IFR1 in the second embodiment, and FIG. 13 is a diagram showing a transport path of the substrate W in the interface block 5 in the second embodiment. The hands H21 to H23 of the interface transport mechanism IFR2 and the hands H11, H12 of the interface transport mechanism IFR1 are controlled by the main controller (control unit) 91.

As shown in FIGS. 11 and 13, the interface transport mechanism IFR2 carries the substrate W from the substrate platform PASS7 of the thermal processing group 121 for post-exposure bake (see FIG. 4) using the hand H22 (Step S31).

The interface transport mechanism IFR2 carries the substrate W from the edge exposure unit EEW using the hand H23 (Step S32). This allows the substrate W to be carried in the edge exposure unit EEW. The interface transport mechanism IFR2 then carries the substrate W held by the hand H22 in the edge exposure unit EEW (Step S33).

The interface transport mechanism IFR2 carries the substrate W from the back surface cleaning processing unit RSW using the hand H21 (Step S34). This allows the substrate W to be carried in the back surface cleaning processing unit RSW. The interface transport mechanism IFR2 subsequently carries the substrate W held by the hand H23 in the back surface cleaning processing unit RSW (Step S35).

The interface transport mechanism IFR1 carries the substrate W from the substrate platform PASS8 using the hand H11 (Step S41 of FIG. 12) as described below. This allows the substrate W to be carried in the substrate platform PASS8. The interface transport mechanism IFR2 subsequently carries the substrate W held by the hand H21 in the substrate platform PASS8 (Step S36).

The interface transport mechanism IFR1 caries the substrate W in the substrate platform PASS9 using the hand H12 (Step S44 of FIG. 12) as described below. Then, the interface transport mechanism IFR2 carries the substrate W from the substrate platform PASS9 using the hand H23 (Step S37). After that, the interface transport mechanism IFR2 carries the substrate W held by the hand H23 in the heating unit HP of the thermal processing group 121 for post-exposure bake (see FIG. 4) (Step S38). The main controller (control unit) 91 controls the interface transport mechanism IFR2 to repeat the processes of Steps S31 to S38.

As shown in FIGS. 12 and 13, the interface transport mechanism IFR1 carries the substrate W from the substrate platform PASS8 using the hand H11 (Step S41).

The interface transport mechanism IFR1 carries the substrate W from the substrate carry-out section 6b of the exposure device 6 using the hand H12 (Step S42). The interface transport mechanism IFR1 subsequently carries the substrate W held by the hand H11 in the substrate carry-in section 6a of the exposure device 6 (Step S43).

As described above, the interface transport mechanism IFR2 carries the substrate W from the substrate platform PASS9 using the hand H23 (Step S37 of FIG. 11). This allows the substrate W to be carried in the substrate platform PASS9. Next, the interface transport mechanism IFR1 carries the substrate W held by the hand H12 in the substrate platform PASS9 (Step S44). The main controller (control unit) 91 controls the interface transport mechanism IFR1 to repeat the processes of Steps S41 to S44.

(4) Effects

In the present embodiment, the substrate W is transported from the substrate platform PASS7 to the edge exposure unit EEW by the hand H22 of the interface transport mechanism IFR2, the substrate W is transported from the edge exposure unit EEW to the back surface cleaning processing unit RSW by the hand H23 of the interface transport mechanism IFR2, and the substrate W is transported from the back surface cleaning processing unit RSW to the substrate platform PASS8 using the hand H21 of the interface transport mechanism IFR2.

The substrate W is transported from the substrate platform PASS8 to the exposure device 6 by the hand H11 of the interface transport mechanism IFR1, and the substrate W is transported from the exposure device 6 to the substrate platform PASS9 by the hand H12 of the interface transport mechanism IFR1.

Therefore, even when contaminants adhere to the substrate W after the exposure processing, the contaminants will not adhere to the hand H21 of the interface transport mechanism IFR2 and the hand H11 of the interface transport mechanism IFR1 that hold the substrates W after the back surface cleaning. This allows the substrate W in the clean state after the back surface cleaning to be carried in the exposure device 6. As a result, the inside of the exposure device 6 can be prevented from being contaminated. Accordingly, even when the exposure processing is performed in vacuum in the exposure device 6, a degree of vacuum is prevented from being lowered due to the contaminants.

Similarly to the first embodiment, the inside of the exposure device 6 is less contaminated, thus reducing a period of time required for removing the contaminants. This prevents a lower operation rate of the substrate processing apparatus.

The hand H11 of the interface transport mechanism IFR1 is arranged above the hand H12. When the substrate W after the exposure processing is Tess clean than the substrate W before the exposure processing, the contaminants may drop from the substrate W after the exposure processing or the hand H12 of the interface transport mechanism IFR1 that holds the substrate W after the exposure processing. Even in such a case, the hand H11 of the interface transport mechanism IFR1 is arranged above the hand H12, so that the contaminants will not adhere to the substrate W before the exposure processing held by the hand H11 of the interface transport mechanism IFR1. This reliably prevents the substrate W to be carried in the exposure device 6 from being contaminated.

The hand H21 of the interface transport mechanism IFR2 is arranged above the hands H22, H23. When the substrate W before the back surface cleaning held by the hands H22, H23 of the interface transport mechanism IFR2 is contaminated, the contaminants may drop from the substrate W before the back surface cleaning or the hands H22, H23 of the interface transport mechanism IFR2 that hold the substrate W before the back surface cleaning. Even in such a case, the hand H21 of the interface transport mechanism IFR2 is arranged above the hands H22, H23, so that the contaminants will not adhere to the substrate W after the back surface cleaning held by the hand H21 of the interface transport mechanism IFR2. This reliably prevents the substrate W to be carried in the exposure device 6 from being contaminated.

[3] Other Embodiments

While each of the interface transport mechanisms IFR1, IFR2 has two or three hands in the above-described embodiments, the present invention is not limited to this. Each of the interface transport mechanisms IFR1, IFR2 may have four or more hands. In this case, even though the number of processing steps of the substrate is increased, the back surface of the substrate can be prevented from being contaminated without decreasing efficiency of the substrate processing.

While the inside of the cooling unit CP or the substrate platform PASS8 in the interface block 5 is filled with dry nitrogen gas in the above-described embodiments, the present invention is not limited to this. The inside of the cooling unit CP or the substrate platform PASS8 in the interface block 5 may be filled with dry inert gas such as helium gas or argon gas. Also in this case, moisture adhering to the substrate W is sufficiently removed. Accordingly, even when the substrate W is transported to the vacuum exposure device, a degree of vacuum in the vacuum exposure device is reliably prevented from being lowered.

When the substrate W after the back surface cleaning is sufficiently dried in the back surface cleaning processing unit RSW, dry gas may not be supplied into the casing 53 of the cooling unit CP shown in FIG. 4 or the casing 53 of the substrate platform PASS8 shown in FIG. 10.

When the temperature of the substrate W after the back surface cleaning in the back surface cleaning processing unit RSW is maintained at a temperature suitable for the exposure processing in the exposure device 6, the cooling unit CP shown in FIG. 4 or the cooling plate 54 of the substrate platform PASS8 shown in FIG. 10 may not be provided. In this case, the interface transport mechanism IFR1 of FIG. 4 transports the substrate W from the back surface cleaning processing unit RSW to the exposure device 6 using the hand H21 or the hand H22.

[4] Correspondences between Elements in the Claims and Parts in Embodiments

In the following paragraphs, non-limiting examples of correspondences between various elements recited in the claims below and those described above with respect to various preferred embodiments of the present invention are explained.

In the above-described embodiments, the exposure device 6 is an example of an exposure device, the substrate processing apparatus 500 is an example of a substrate processing apparatus, the substrate W is an example of a substrate, the indexer block 1, the anti-reflection film processing block 2, the resist film processing block 3 and the development processing block 4 are an example of a processing section, the interface block 5 is an example of an interface, the resist film coating processing unit 30 is an example of a photosensitive film forming unit, the back surface cleaning processing unit RSW is an example of a back surface cleaning unit, the hands H11 to H13, H21 to H23 are examples of a holder, the interface transport mechanisms IFR1, IFR2 are examples of a transport device, the casing 53 is an example of a housing, dry nitrogen gas is an example of dry gas, the nitrogen supply device 70 is an example of a gas supplier, the substrate platform PASS9 is an example of a platform, the interface transport mechanism IFR1 is an example of a first transport unit, and the interface transport mechanism IFR2 is an example of a second transport unit.

In the first embodiment, the cooling unit CP is an example of a temperature adjuster, the hand H11 is an example of a first holder, the hand H12 is an example of a second holder, the hand H13 is an example of a third holder, the hand H21 is an example of a fourth holder, and the hand H22 is an example of a fifth holder.

In the second embodiment, the substrate platform PASS8 is an example of the temperature adjuster, the hand I-III is an example of the first holder, the hand H21 is an example of the second holder, the hand H12 is an example of the third holder, the hand H22 is an example of the fourth holder, and the hand H23 is an example of the fifth holder.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A substrate processing method for subjecting a substrate to processing using a substrate processing apparatus arranged adjacent to an exposure device,
the substrate processing method comprising the steps of:
forming a photosensitive film made of a photosensitive material on a top surface of the substrate by a photosensitive film forming unit of the substrate processing apparatus;
cleaning a back surface of the substrate by a back surface cleaning unit of the substrate processing apparatus after the formation of the photosensitive film and before exposure processing by the exposure device;
transporting the substrate after the back surface cleaning by the back surface cleaning unit to a temperature adjuster of the substrate processing apparatus while holding the substrate after the back surface cleaning using a first holder of the substrate processing apparatus;
adjusting a temperature of the substrate by the temperature adjuster;
transporting the substrate before the exposure processing from the temperature adjuster to the exposure device while holding the substrate before the exposure processing using a second holder of the substrate processing apparatus; and
transporting the substrate after the exposure processing from the exposure device to a first platform of the substrate processing apparatus while holding the substrate after the exposure processing using a third holder of the substrate processing apparatus.

2. The substrate processing method according to claim 1, further comprising the step of transporting the substrate after the exposure processing from the first platform to a thermal processing group of the substrate processing apparatus while holding the substrate after the exposure processing using a fourth holder of the substrate processing apparatus.

3. The substrate processing method according to claim 2, further comprising the step of transporting the substrate placed on a second platform of the substrate processing apparatus to the back surface cleaning unit while holding the substrate placed on the second platform using the third holder, after the formation of the photosensitive film and before the cleaning of the back surface of the substrate by the back surface cleaning unit.

4. The substrate processing method according to claim 3, further comprising the steps of:
exposing an edge of the substrate by an edge exposure unit of the substrate processing apparatus after the formation of the photosensitive film and before the substrate is placed on the second platform; and
transporting the substrate after the edge exposure by the edge exposure unit to the second platform while holding the substrate after the edge exposure using the fourth holder.

5. The substrate processing method according to claim 4, further comprising the step of transporting the substrate after the formation of the photosensitive film and before the edge exposure by the edge exposure unit to the edge exposure unit while holding the substrate using a fifth holder of the substrate processing apparatus.

6. The substrate processing method according to claim 2, further comprising the steps of:
exposing an edge of the substrate by an edge exposure unit of the substrate processing apparatus after the formation of the photosensitive film and before the cleaning of the back surface of the substrate by the back surface cleaning unit; and transporting the substrate after the edge exposure by the edge exposure unit to the back surface cleaning unit while holding the substrate using the fourth holder.

7. The substrate processing method according to claim 6, further comprising the step of transporting the substrate after the formation of the photosensitive film and before the edge exposure by the edge exposure unit to the edge exposure unit while holding the substrate using a fifth holder of the substrate processing apparatus.

8. The substrate processing method according to claim 1, wherein the temperature adjuster includes:

a housing arranged to surround the substrate, and a gas supplier arranged to supply dry gas into the housing.

9. The substrate processing method according to claim 1, wherein the third holder is arranged below the first and second holders.

10. The substrate processing method according to claim 1, wherein the second holder is arranged above the first holder.

\* \* \* \* \*